(12) United States Patent
Rolin et al.

(10) Patent No.: US 8,796,067 B2
(45) Date of Patent: Aug. 5, 2014

(54) METHOD FOR FORMING AN ORGANIC MATERIAL LAYER ON A SUBSTRATE

(75) Inventors: Cedric Rolin, Auderghem (BE); Jan Genoe, Messelbroek (BE)

(73) Assignees: IMEC (BE); Nederlandse Organisatie voor Toegepast-Natuurwe tenschappelijk Onderzoek (TNO) (NL); UniversitéCatholique de Louvain (UCL) (BE)

(*) Notice: Subject to any disclaimer, the term of this patent is extended or adjusted under 35 U.S.C. 154(b) by 380 days.

(21) Appl. No.: 13/303,037

(22) Filed: Nov. 22, 2011

(65) Prior Publication Data
US 2012/0129296 A1 May 24, 2012

Related U.S. Application Data

(63) Continuation of application No. PCT/EP2009/063342, filed on Oct. 13, 2009.

(60) Provisional application No. 61/181,231, filed on May 26, 2009.

(51) Int. Cl.
*H01L 51/40* (2006.01)

(52) U.S. Cl.
USPC ...... 438/99; 257/40; 257/E21.299; 427/255.6

(58) Field of Classification Search
USPC ............. 438/99; 257/40, E21.299; 427/255.6
See application file for complete search history.

(56) References Cited

U.S. PATENT DOCUMENTS

| | | | |
|---|---|---|---|
| 5,552,017 A | 9/1996 | Jang et al. | |
| 6,239,043 B1 | 5/2001 | Lai | |
| 6,337,102 B1 | 1/2002 | Forrest et al. | |
| 6,620,289 B1 | 9/2003 | Yan et al. | |
| 8,163,343 B2 * | 4/2012 | Kher et al. | 427/255.34 |
| 2002/0155230 A1 | 10/2002 | Forrest et al. | |
| 2003/0209323 A1 | 11/2003 | Yokogaki | |
| 2005/0109281 A1 | 5/2005 | Jurgensen et al. | |
| 2007/0163497 A1 | 7/2007 | Grace et al. | |

FOREIGN PATENT DOCUMENTS

| WO | WO 2005/059974 A1 | 6/2005 |
|---|---|---|
| WO | WO 2007/084275 A1 | 7/2007 |

OTHER PUBLICATIONS

M. Kitamura et al., "Pentacene-based organic field-effect transistors", Journal of Physics: Condensed Matter 20, 2008, 184011.

(Continued)

*Primary Examiner* — Kimberly Rizkallah
*Assistant Examiner* — Maria Ligai
(74) *Attorney, Agent, or Firm* — Knobbe, Martens, Olson & Bear LLP

(57) ABSTRACT

A method for forming an organic material layer on a substrate in an in-line deposition system is disclosed. In one aspect, the organic material is deposited with a predetermined non-constant deposition rate profile, which includes a first predetermined deposition rate range provided to deposit at least a first monolayer of the organic material layer with a first predetermined average deposition rate and a second predetermined deposition rate range provided to deposit at least a second monolayer of the organic material layer with a second predetermined average deposition rate. The injection of organic material through the openings of the injector is controlled for realizing the predetermined deposition rate profile.

14 Claims, 17 Drawing Sheets

(56) References Cited

OTHER PUBLICATIONS

A. Di Carlo et al., "Influence of grain sizes on the mobility of organic thin film tramsistors", Applied Physics Letters 86, 263501, 2005.

C. Rolin et al., "Pentacene devices and logic gates fabricated by organic vapor phase deposition", Applied Physics Letters, vol. 89, No. 20, Nov. 14, 2006, pp. 203502-203502.

F. Lindla et al., "Layer cross-fading at organic/organic interfaces in OVPD-processed red phosphorescent organic light emitting diodes as a new concept to increase current and luminous efficacy", Mater. Res. Soc. Symp. Proc. vol. 1154, 2009.

B. Marheineke, "OVPD: OLED manufacturing coming of age", Proceedings of the SPIE, vol. 5961, Jul. 26, 2005, pp. 596101-1.

International Search Report for International Application No. PCT/EP2009/063342 dated Jan. 29, 2010 by European Patent Office.

* cited by examiner

METHOD FOR FORMING AN ORGANIC MATERIAL LAYER ON A SUBSTRATE

CROSS REFERENCE TO RELATED APPLICATIONS

This application is a continuation of PCT Application No. PCT/EP2009/063342, filed Oct. 13, 2009, which claims priority under 35 U.S.C. §119(e) to U.S. provisional patent application 61/181,231 filed on May 26, 2009. Each of the above applications is incorporated herein by reference in its entirety.

BACKGROUND OF THE INVENTION

1. Field of the Invention

The disclosed technology relates to a method for forming an organic material layer on a substrate in an in-line deposition system, to an organic material layer such obtained, to the use of such a method in a process for forming an organic thin film transistor, to an injector for use in such an in-line deposition system, and to an in-line deposition system for use in such a method.

2. Description of the Related Technology

The industrial production of devices and circuits based on small organic semiconducting molecules requires the availability of high throughput deposition techniques to grow such films. High throughputs require a technology that allows depositing a large amount of organic material over large area substrates while ensuring a good optical and/or electrical quality and a good uniformity of the deposited films. To reach such a goal, a commonly proposed approach is reel-to-reel (or roll-to-roll) processing, in which small organic semiconducting molecules are distributed by a linear elongated source over a continuously moving substrate.

For the growth of thin films based on small organic molecules in reel-to-reel conditions, two techniques have been proposed: in-line organic molecular beam deposition (OMBD, also referred to as vacuum thermal evaporation) and in-line organic vapor phase deposition (OVPD).

In-line OMBD is a high vacuum process in which the organic molecules are thermally evaporated from an elongated source. The evaporated molecules travel in the molecular flow regime towards a temperature-controlled substrate on which they condense to form a thin film. The substrate and the elongated source are in relative motion in a direction perpendicular to the direction of elongation of the source. The elongated sources are typically sealed with lid structures having a plurality of apertures, the size, shape and spacing of which can be adjusted to meet uniformity requirements, as e.g. described in US 2007/0163497.

An OVPD process uses an inert carrier gas to transport organic molecules from a source cell onto a cooled substrate in a hot-walled low-pressure chamber. The carrier gas convectively transports the organic molecules away from the source towards a temperature controlled substrate on which the organic molecules condense to form a thin film. OVPD can be preformed in an in-line system in which the loaded carrier gas is distributed by an elongated injector onto the substrate. The substrate and elongated injector are in relative motion in a direction perpendicular to the direction of elongation of the injector. Several geometries for the elongated injector have been proposed. The most convenient one is the showerhead, consisting of a plate with a plurality of openings or apertures through which the carrier gas flows towards the substrate. In-line OVPD deposition systems are for example referred to in U.S. Pat. No. 6,337,102 and in US 2005/0109281.

The extension of a static organic layer deposition system to an in-line system with a reel-to-reel geometry influences the deposition rate profile of the organic layers. The deposition rate profile can be defined as the deposition rate as a function of time during the deposition process at a given location on a substrate. In static processing systems the deposition rate can easily be held constant during the whole deposition process by ensuring a constant rate of evaporation of material at the source. This method gives rise to a square-shaped deposition rate profile, with abrupt transitions from no deposition to deposition and from deposition to no deposition, and with a constant deposition rate during deposition. However, in an in-line geometry the relative motion between the substrate and the elongated organic molecules injector (e.g. showerhead) is a source of variation of the deposition rate. At a location on the substrate that is far away from the injector, the deposition rate is zero. At a location on the substrate in front of the injector, the deposition rate is at its maximum. In between these points the deposition rate varies according to a deposition rate profile. In order to mimic the deposition rate profile obtained in static systems, the different parts of an in-line deposition system are in general designed such that the deposition rate profile has a shape that is as square as possible.

A high throughput reel-to-reel processing tool may be able to continuously coat a substrate moving at a constant speed (further referred to as 'substrate speed') of e.g. 1 m/min or more. In case of deposition of a layer by means of an in-line system, e.g. a reel-to-reel system, the linear deposition speed can be used as a defining parameter. The linear deposition speed can be defined as the product of the deposited thickness and the substrate speed. It can be expressed in micrometer$^2$/s. For example, when an in-line production tool with a substrate speed of 1 m/min is used for depositing a 30 nm thick organic layer on the substrate, a linear deposition speed of 30 nm×1 m/min=500 micrometer$^2$/s is needed. It can be shown that the linear deposition speed at a given point on the substrate equals the product of the substrate speed with the integral of the deposition rate profile over the whole period of the deposition.

It is an advantage of a reel-to-reel geometry that it allows high throughput production of uniform organic films, for example for fabricating OLEDs (Organic Light Emitting Devices). A reel-to-reel system is considered to be a high throughput system if it is able to continuously coat a substrate moving at a substrate speed above 1 m/min. However, high deposition rates lead to organic films of a poor electrical quality. When such films are used for fabricating OTFTs (Organic Thin Film Transistors), this leads to devices with low charge carrier mobility and thus poor quality. For example, in "Pentacene-based organic field-effect transistors", M. Kitamura et al., Journal of Physics: Condensed Matter 20 (2008) 184011, report that the grain size of pentacene thin films deposited by thermal evaporation decreases with increasing deposition rate. The grain size in pentacene films significantly influences carrier transport in these films. The mobility increases monotonically with the grain size. In "Influence of grain sizes on the mobility of organic thin film transistors", Applied Physics Letters 86, 263501, 2005, A. Di Carlo et al. report that, for a given substrate temperature, the size of the grains is larger for lower deposition rates. High deposition rates deliver very small grains. Moreover, a strong dependency of the mobility on the grain size is reported. It is shown that the field-effect-extracted mobility abruptly drops for a grain size smaller than 2 micrometer. Therefore, the best transistor characteristics are usually obtained with films deposited at a rather low deposition rate (and thus a large grain size).

With a static OMBD system, the best Organic Thin Film Transistors (OTFTs) are made with films grown at deposition rates below 0.25 Å/s. This leads to a total deposition time of 1200 s for a 30 nm thick film. Such long deposition times are unpractical if one aims at the fabrication at an industrial scale of organic circuits comprising OTFTs. Using a static OVPD system, good pentacene OTFTs are reported with deposition rates up to 9.5 Å/s (C. Rolin et al, "Pentacene devices and logic gates fabricated by organic vapor phase deposition", Applied Physics Letters 89, 203502 (2006)).

Definitions

In-line deposition system: a system for depositing a layer of a material on a substrate, wherein the material is provided through a linear elongated injector and wherein the substrate and the linear elongated injector are in relative movement.

Substrate speed: speed of a substrate relative to an injector.

Longitudinal direction of a linear elongated injector: the direction substantially orthogonal to the direction of substrate movement.

Length of a linear elongated injector: size of the injector in the longitudinal direction of the injector.

Width of a linear elongated injector: size of the injector in a direction substantially orthogonal to the longitudinal direction and in the plane of the injector.

Thickness of a linear elongated injector: size of the injector in a direction substantially orthogonal to the plane of the injector.

Front edge and back edge of a linear elongated injector: sides of the injector substantially orthogonal to the direction of substrate movement, wherein the front edge is the edge where a given point of the moving substrate enters the deposition zone underneath the injector, and wherein the back edge is the edge where a given point of the moving substrate leaves the deposition zone underneath the injector.

Distance between the front edge and the back edge of the injector: the width of the injector.

Symmetric injector: an injector that comprises two parts that are identical mirror images of each other, wherein the axis of symmetry is oriented along the longitudinal direction of the injector.

Asymmetric injector: injector that cannot be divided along its longitudinal direction into two halves that are identical minor images of each other.

Deposition rate profile: the deposition rate as a function of time during a deposition process at a given location on a substrate. A typical deposition rate profile shows a rising edge, followed by a period with a maximum deposition rate and a falling edge or trailing edge. The rising edge is characterized by an increase of the deposition rate from zero to the maximum value. The falling edge or trailing edge of the deposition rate profile is characterized by a decrease of the deposition rate from the maximum value to zero. In between the rising edge and the trailing edge the deposition rate can be constant or it can vary. A symmetric deposition rate profile is a profile that comprises two parts that are identical mirror images. For example, in a symmetric deposition rate profile the trailing edge is the mirror image of the rising edge. An asymmetric deposition rate profile is a deposition rate profile that can not be divided into two halves that are identical minor images of each other.

Linear deposition speed of an in-line deposition system at a given point of a substrate: the product of the substrate speed and the (final) thickness of a layer or film deposited at that point of a substrate. The linear deposition speed at a given point on the substrate equals the product of the substrate speed with the integral of the deposition rate profile over the whole period of the deposition. It can be expressed in micrometer$^2$/s.

Average deposition rate of an in-line deposition system at a given point on a substrate: the average of the deposition rate over a certain period of time at that point of the substrate.

Material utilization efficiency: the ratio between the amount of material (in moles) deposited on the substrate and the amount of material (in moles) evaporated from the source. The higher this efficiency, the less material is wasted during the process.

Showerhead: a plate with a plurality of openings or apertures through which a carrier gas flows towards the substrate.

SUMMARY OF CERTAIN INVENTIVE ASPECTS

Certain inventive aspects relates to a more efficient method for depositing organic layers, and an in-line deposition system and an injector for use in such a method.

In one aspect, the method allows to deposit organic layers with a good uniformity, such as a uniformity better than ± about 1% of the desired organic layer thickness, a good electrical quality (e.g., having charge carrier mobilities higher than about 0.5 cm$^2$/Vs), at a high throughput (e.g., with a linear deposition speed larger than about 500 micrometer$^2$/s), and with a good material efficiency (e.g., in the range from about 50% to 75% efficiency, more particularly about 60% to 75%.) In one aspect, the method can for example be used for high throughput, e.g. reel-to-reel, fabrication of organic thin film transistors or organic circuits comprising such transistors.

The methods known in the art to deposit an organic material layer on a substrate in an in-line deposition system are in general designed such that the deposition rate profile has a shape that is as square as possible, i.e. to deposit the organic material layer with a constant deposition rate profile. However, in order to obtain an organic material layer with a good electrical quality, e.g. having charge carrier mobilities higher than about 0.5 cm$^2$/VS, the organic material layer needs to be deposited with a low deposition rate. As a result, the methods known in the art are not able to deposit an organic material layer at a high throughput e.g. with a linear deposition speed larger than about 500 micrometer$^2$/s and with a good electrical quality.

The inventor has surprisingly found that, in order to obtain an organic material layer with a good electrical quality, the morphology of at least the first monolayer is critical for the quality of the entire organic material layer and needs to be optimized. In fact, at least the first monolayer of the organic material layer needs to have a good electrical quality to obtain an organic material layer with a good electrical quality. Preferably, at least the first two monolayers, and more preferably, at least the first four monolayers, need to have a good electrical quality. In order to get organic material layers with a good electrical quality, an in-line deposition system should be able to grow at least the first monolayer, and preferably at least the first two, three or four monolayers, at a lower average deposition rate compared to the subsequent layers.

Thereto, one inventive aspect relates to a method for forming an organic material layer with a material thickness on a substrate in an in-line deposition system, wherein the organic material is deposited with a non-constant deposition rate profile which comprises a first predetermined deposition rate range provided to deposit at least one first monolayer of the organic material layer with a first predetermined average deposition rate onto the substrate and a second predetermined deposition rate range provided to deposit at least one second monolayer of the organic material layer with a second predetermined average deposition rate onto the at least one first monolayer provided on the substrate, the first average deposition rate being smaller than the second average deposition rate, and wherein the injection of organic material through the openings of the injector towards the substrate is controlled for realizing the predetermined deposition rate profile.

Because only the first monolayer, and preferably at least the first few monolayers, need to be deposited at a small average deposition rate and the next monolayers can be deposited with a higher average deposition rate in order to obtain an organic material layer with a good electrical quality, the method according to one aspect is able to deposit the entire organic material layer with a high linear deposition rate. In addition, because the inventor has found that the electrical quality of the entire organic material layer is in particular determined by the electrical quality of the at least first monolayer, preferably of the first few monolayers, the method according to one aspect is able to deposit an organic material layer with a good electrical quality. The method according to one aspect is able to deposit an organic material layer with the same electrical quality and a higher linear deposition speed compared to the existing methods.

In one aspect, the first predetermined deposition rate range is chosen such that the first predetermined average deposition rate is able to assure a good electrical quality of the at least first monolayer, and thus of the entire organic material layer. The numeric value of the first predetermined average deposition rate will depend on the application for which it is used for. In one aspect, the first predetermined average deposition rate will be below about 0.1 nm/s, more particularly below about 0.025 nm/s.

In one aspect, the second predetermined deposition rate range is chosen such that the second predetermined average deposition rate is able to assure a high linear deposition rate of the entire organic material layer. Thereto, the second predetermined average deposition rate may be higher than about 1 nm/s, particularly higher than about 5 nm/s.

The non-constant predetermined deposition rate profile of the method according to one aspect can be a symmetric or non-symmetric deposition rate profile.

In one aspect, the predetermined deposition rate profile is a symmetric non-constant deposition rate profile, wherein the rising edge is a mirror image of the trailing edge. The deposition rate continuously rises from zero up to a maximum deposition rate and then decreases back to zero. The rising edge of the deposition rate profile needs to be chosen such that a good electrical quality, and thus a low first predetermined average deposition rate, of the first monolayer, and preferably of the first few monolayers, can be assured.

The inventor has found that, in the existing deposition methods, which aim at obtaining a deposition rate profile which is as constant as possible, the rising edge of the deposition rate profile will be too steep to ensure a good control of the at least first monolayer. As a result, the existing methods will not be able to deposit the at least first monolayer, preferably the at least few monolayers, with a good electrical quality, i.e. at a low deposition rate.

In one aspect the predetermined deposition rate profile is an asymmetric deposition rate profile, wherein the rising edge is not a minor image of the trailing edge. The rising edge of the deposition rate profile is preferably chosen such that a good electrical quality, and thus a low first predetermined average deposition rate, of the first monolayer, and preferably of the first few monolayers, can be assured. The trailing edge is preferably chosen substantially steeper than the rising edge, allowing a fast growth of the subsequent monolayers, and thus a high linear deposition speed of the entire organic material layer. An asymmetric deposition rate profile may therefore result in a higher linear deposition speed of the organic material layer with equal electrical quality compared to a symmetric deposition rate profile.

The injection of organic material through the openings of the injector towards the substrate is controlled for realizing the predetermined deposition rate profile.

The predetermined deposition rate profile may for example be obtained by adapting a parameter of at least part of the plurality of openings of the injector, such as for instance, but not being limited to the size, the shape, the orientation, the depth and/or the location of at least part of the plurality of openings or the distance between at least part of the plurality of openings.

The layers may for example be grown on a moving substrate in an in-line system with a reel-to-reel geometry, e.g. a reel-to-reel OVPD system or a reel-to-reel OMBD system.

In case of an OVPD system, the injection of organic material through the openings of the injector is controlled by controlling a gas flow of the carrying gas. Controlling the gas flow towards the substrate may for instance be obtained by adapting a distance between the injector and the substrate in the direction of substrate movement or by adapting an angle between a surface of the substrate and a surface of the injector. Other methods may be used for providing a predetermined deposition rate profile, such as for example adapting geometrical parameters of the process chamber of the in-line system, e.g. adapting the position of pump ports, etc. Different methods may be combined.

In one aspect, the method may be used in a process for forming an organic thin film transistor or in a process for forming an organic circuit comprising organic thin film transistors.

Another inventive aspect relates to an injector for use in an in-line deposition system and to an in-line deposition system which is adapted for providing a predetermined deposition rate profile of an organic material layer on a substrate according to one aspect.

Certain inventive aspects are particularly pointed out and distinctively claimed in the claim section concluding this document. The invention however, both as to organization and method of operation, together with features and advantages thereof, may best be understood by reference to the following detailed description when read with the accompanying drawings.

BRIEF DESCRIPTION OF THE DRAWINGS

The invention will be further elucidated by means of the following description and the appended drawings.

DETAILED DESCRIPTION OF CERTAIN ILLUSTRATIVE EMBODIMENTS

Figure 1:
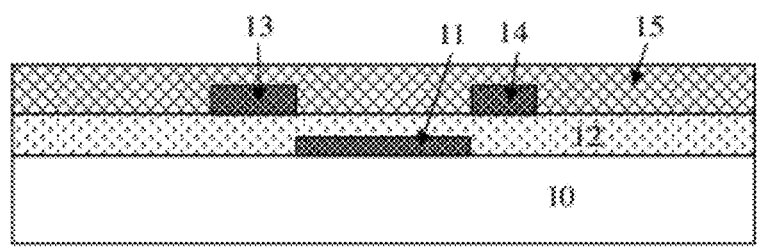
FIG. 1 schematically illustrates the structure of an organic thin film transistor.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Certain embodiments relate to a method for depositing organic layers with a predetermined deposition rate profile. It allows depositing organic layers with a good uniformity (e.g. a uniformity better than ± about 1% of the desired organic layer thickness) and a good electrical quality (e.g. having charge carrier mobilities higher than about 0.1 $cm^2V/s$ for n-type materials, e.g. higher than about 0.5 $cm^2/Vs$ for pentacene) at a high throughput, allowing depositing organic layers at high deposition speeds (e.g. linear deposition speed larger than about 500 $micrometer^2/s$). In one embodiment, the method can for example be performed in an in-line tool such as a reel-to-reel tool with a substrate speed beyond about 1 m/min. In one embodiment, the method can for example be used for high throughput, e.g. reel-to-reel, fabrication of organic devices or organic circuits.

The invention is further described more in detail for embodiments wherein organic layers are deposited by means of an in-line OVPD system and wherein the elongated injector is a showerhead. However, other in-line systems such as e.g. in-line OMBD systems may be used for depositing the organic layers and other types of elongated injectors may be used.

The method is further described for depositing organic layers of OTFTs (organic field effect transistors), wherein the preferred deposition rate profile is a profile wherein the first monolayers of the organic layer are grown at a low deposition rate and wherein the remaining part of the organic layer is grown at a high deposition rate. However, the method is not limited thereto and can be used for depositing organic layers of other devices such as for example organic solar cells, OLEDs (organic light emitting devices) or organic lasers. The method can also be used for depositing organic layers with other, predetermined deposition rate profiles.

The method can be used for depositing a broad range of materials. Examples of materials that can be deposited with the method are: oligoacenes (naphthalene, anthracene, tetracene, pentacene, perylene, rubrene) and their derivatives (NTCDI, functionalized NTCDI, Me2-Pentacene, TIPS-pentacene, F-pentacene, PTCBI, PTCDI (or PDI), functionalized PTCDI, PDIF-CN2); oligothiophenes (sexithiophene, quaterthiophene) and their derivatives (DH-4T, DH-6T, Et-6T, bis-BDT, bis-TDT, DFH-4T, DFH-6T, DFHCO-4T, DFH-PCO-4T, DFHCO-4TCO, T3CN, DCMT); oligophenylenes (hexaphenyl, terphenyl) and their derivatives (DPh-BDX (X=S,Se,Te), spiro-compounds, graphenes); triarylamines (TPD, CBP, NPB, mCP); phtalocyanine oligomers (Cu-Pc, H2-Pc, Zn-Pc, Sub-Pc, Ti-Pc) and their derivatives (Fluorinated phtalocyanines such as F-CuPc); fullerenes (C60, C70, C84) and their derivatives (PCBM); organo-metallic chelates (Alq3) and other types of metal complexes based on Ir and Ru; tetrathiafulvalenes (TTF, BEDT-TTF, DN-TTF); TCNQ and its derivatives (F4-TCNQ); bathocuproine (BCP); and any combination of the derivatives of above mentioned families: DPh-BDX, Dec-(TPhT)2-Dec, ATD, ATD-TIPS, DH-PPTPP, CF-PTZ, FTTTTF, C14-Ph2NTTF, C12-PhNTTF. This list of materials is not intended to be restrictive, but only to provide examples.

Typical layer thicknesses are in the range between 5 nm and 1 micrometer, e.g. in the range between 30 nm and 200 nm. However, other layer thicknesses are possible. One monolayer typically has a thickness of 15 Å.

In certain embodiments of the present invention, the term "substrate" may include any underlying material or materials that may be used, or upon which an organic layer or a device may be formed in accordance with certain embodiments of the present invention. The term "substrate" is thus used to define generally the elements for layers that underlie a layer or portions of interest. The substrate may be a rigid substrate or a flexible substrate. Examples of rigid substrates are plastic, glass, steel, aluminium and semiconductor substrates such as e.g. Si, GaAs or SiC substrates. Flexible substrates that may be used are for example PEN foil, PET foil, paper. The list of substrates is not intended to be restrictive, but only to provide examples.

In certain embodiments of the present invention a predetermined deposition rate profile in an in-line, e.g. reel-to-reel, deposition system can for example be obtained by providing a showerhead that is adapted for delivering such predetermined deposition rate profile on a substrate moving relative to the showerhead. The showerhead can for example be adapted for delivering a predetermined deposition rate profile by adapting the size and/or the spacing and/or the depth and/or the orientation of the openings through which the process gas flows to the substrate. A predetermined deposition rate profile can for example also be obtained by varying the distance between the showerhead and the substrate in the direction of substrate movement. Other methods may be used for providing a predetermined deposition rate profile, such as for example adapting geometrical parameters of the process chamber, e.g. OVPD process chamber, of the in-line system, e.g. adapting the position of pump ports Another method that may be used comprises providing successive injectors with different deposition rates. Using successive injectors with different deposition rates may be a less preferred solution because of e.g. a higher tool cost, larger tool size and lower flexibility in the shape of the deposition rate profiles. Different methods may be combined to obtain a predetermined deposition rate profile.

In one embodiment of the present invention organic layers are grown with a non-constant deposition rate with a predetermined deposition rate profile, wherein the first sublayers (e.g. a few monolayers) of the organic layer are grown at a low deposition rate, e.g. at a deposition rate below 0.1 about nm/s, e.g. below about 0.025 nm/s, and wherein subsequent sublayers of the organic layer are grown at a high deposition rate, e.g. a deposition rate higher than about 1 nm/s, e.g. higher than about 5 nm/s, leading to an high deposition speed. The layers may be grown on a substrate moving at constant speed in a reel-to-reel OVPD system, wherein a showerhead is provided that is adapted for delivering a non-constant deposition rate with a predetermined deposition rate profile, e.g. with a progressive increase of the deposition rate in the direction of substrate movement.

The method according to one embodiment is in particular suitable in a process for forming an Organic Thin Film Transistor (OTFT), a structure which is schematically shown on FIG. 1. In OTFTs, a voltage on the gate electrode 11 provokes an accumulation of charges at the interface between a dielectric layer 12 and the active organic layer 15. These accumulated charges can flow laterally due to a potential difference between the source electrode 13 and the drain electrode 14. Due to this accumulation of charges in a very thin two-dimensional region at the interface between the dielectric layer and the active organic layer, most of the charge carrier transport occurs in this accumulation region, i.e. in the first few monolayers of the active organic film 15 (e.g. in a region with a thickness of up to 2 nm). Therefore mainly the morphology of these first monolayers is critical and needs to be optimized in order to obtain good transistor characteristics. For example, in organic p-type circuit applications, an organic semiconducting thin film of good quality preferably has high charge carrier mobilities (e.g. saturation thin film mobilities above 0.5 cm²/Vs), small positive threshold voltages within the 0V to 1V range and a good uniformity of the electrical characteristics (e.g. spread of threshold voltages lower than 0.15V standard deviation). In order to obtain a good morphology, the first monolayers are preferably grown in 2D mode, forming continuous layers on top of each other. These monolayers are polycrystalline and they preferably have a good intragrain quality, i.e. within a grain they preferably have a high crystalline quality and a low density of intrinsic and extrinsic (chemical) defects. The intragrain quality can for example be controlled by using ultra pure source material, very low roughness substrates and by optimizing substrate pretreatment processes. Preferably the grain boundary density is low, i.e. large grains are preferred. The grain boundary density can e.g. be lowered by increasing the substrate temperature and lowering the deposition flux. Subsequent growth (e.g. up to a thickness 30 nm for a pentacene transistor) of the organic semiconductor layer can for example occur in a 3D mode, thereby filling gaps at the grain boundaries and providing some protection for the active region. The active region of a thin film transistor channel is defined as the region in which more than 90% of the charge is accumulated during normal transistor operation. It is usually limited to the first two monolayers of the thin film. Even at high deposition rates, the morphology of the subsequently grown layers may closely follow the pattern of the first few monolayers. Therefore, in order to obtain good transistors, there is a need for a very good control over the growth or deposition of the first few monolayers. The deposition of the subsequent sublayers can be done under less stringent growth conditions, e.g. at a higher deposition rate, than the first few monolayers.

Figure 2:
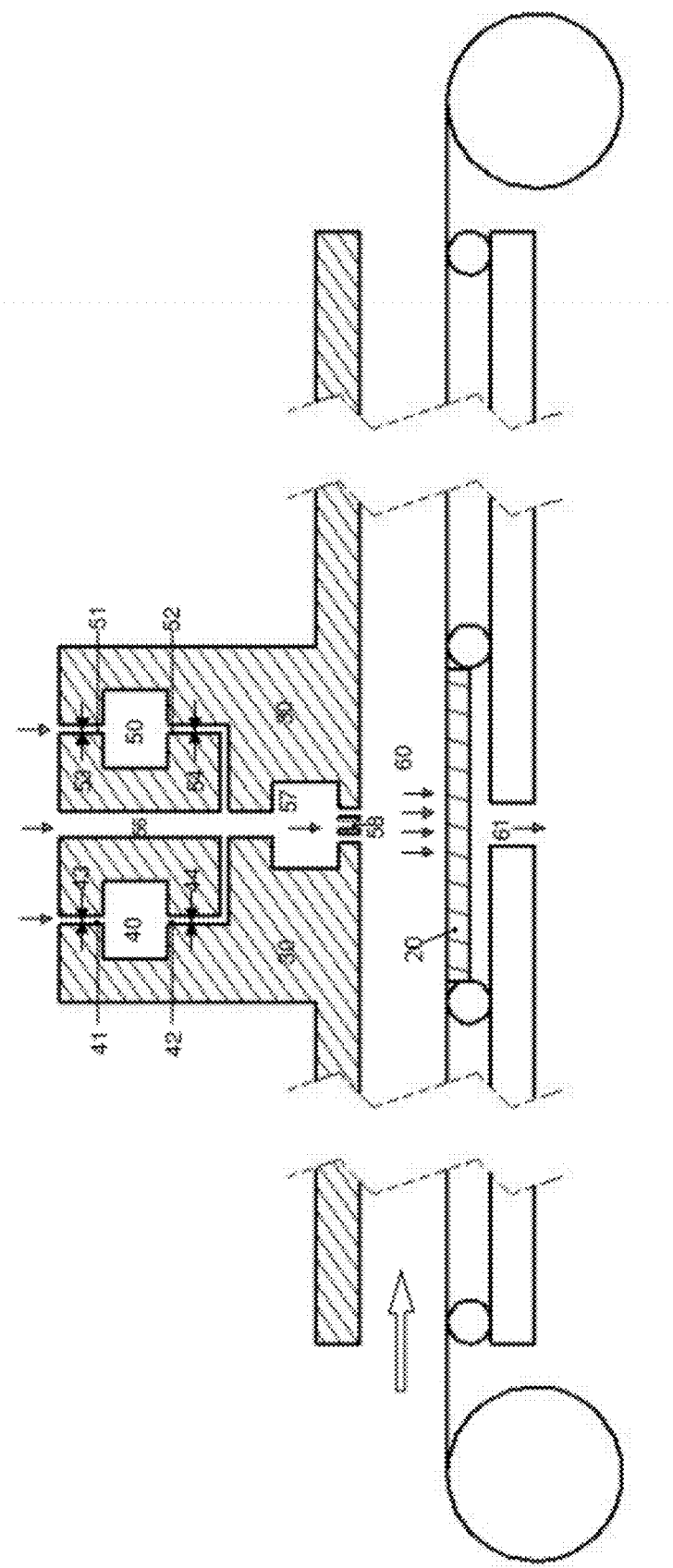
FIG. 2 is a schematic drawing of a reel-to-reel OVPD system.

FIG. 2 shows a schematic drawing of a reel-to-reel OVPD system. The drawing shows a cross-section of an in-line OVPD system cut along the direction of substrate movement (indicated with an arrow in FIG. 2). In the example shown, a large area, flexible substrate 20 is rolled out at the left side, and linearly moves, at a well-controlled constant substrate speed, to the right side of the system, where it is rolled up again. The system can contain several fabrication stages for different coatings and treatments needed to fabricate devices. At least one of the fabrication stages can for example be an OVPD stage (shown in FIG. 2). The OVPD stage shown in FIG. 2 comprises a furnace 30 (dashed parts) heated to a temperature (e.g. in the range between 200° C. and 450° C.) that is substantially equal to the sublimation temperature of the organic source material. Within the furnace 30 a plurality of sources of material can be provided. In FIG. 2 two such sources 40, 50 are shown. The inlet 41, 51 and outlet 42, 52 of each individual source can be closed or opened by valves 43, 44, 53, 54. In the furnace 30 a dilution line 56 is provided, allowing to set the total carrier gas flow independently of the source flow. A carrier gas, e.g. an inert gas such as Helium, Nitrogen or Argon, is flowing through the source cells, where it is loaded with the sublimated organic molecules. At low carrier gas flow rate or high source pressure, a thermodynamic equilibrium is established in which the partial pressure of the organic molecules equals their equilibrium vapor pressure at the furnace temperature. At high flow or low source pressure, a kinetic regime is established in which the partial pressure of the organic molecules is constant but lower than their equilibrium vapor pressure at the furnace temperature. The carrier gas loaded with organic molecules (also called the process gas) enters a mixing chamber 57 having a bottom plate, e.g. a showerhead 58, comprising a plurality of openings or holes. In FIG. 2 a showerhead 58 with three rows of holes is schematically shown. The role of the showerhead 58 is to inject the carrier gas loaded with organic molecules in the process chamber 60 and to distribute it in a controlled way onto the linearly moving substrate 20. The temperature of the substrate 20 is controlled by any appropriate method known by a person skilled in the art. The temperature of the substrate can for example be in the range between 40° C. and 90° C., e.g. in the range between 60° C. and 75° C. Finally the carrier gas is pumped out of the process chamber 60 through a pump port 61. In the example shown in FIG. 2, the pump port 61 is located opposite to the central row of openings of the showerhead 58. However, other positions of the pump port 61 are possible and/or more than one pump port 61 can be present.

Figure 3:
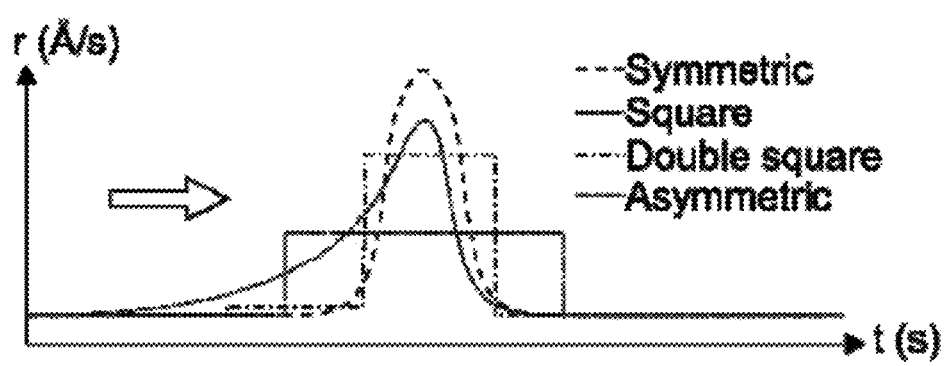
FIG. 3 shows different deposition rate profiles.

FIG. 3 shows four examples of deposition rate profiles that can be realized with the in-line deposition system of FIG. 2 on a substrate moving in a direction perpendicular to the longitudinal direction of the showerhead. The deposition rate profile is defined as the deposition rate at a given point on the linearly moving substrate as a function of time. The final thickness of the organic layer that is deposited on the substrate is proportional to the time integral of the deposition rate profile, i.e. to the area under the deposition profile curve. This area is the same for the three profiles shown in FIG. 3.

The dashed line in FIG. 3 shows a square deposition rate profile. At the rising edge of the deposition rate profile, the deposition rate at a given point on the substrate abruptly increases from zero to a maximum and constant deposition rate value and later on, at the trailing edge of the deposition rate profile, abruptly drops back to zero. Such a deposition rate profile is suitable for depositing a thin layer at a constant deposition rate. The methods known in the art are in general designed to obtain such a deposition rate profile.

The spaced dots in FIG. 3 illustrate a more realistic deposition rate profile that can be obtained when using a symmetric linear showerhead and a pump port located opposite to the centre of the showerhead. Here, the deposition rate increases continuously from zero up to a maximum deposition rate. It then decreases again to zero in a symmetric way, i.e. the deposition rate profile is a symmetric profile. This means that when a substrate is moving below the showerhead, the growth of the initial layers always occurs at a relatively low deposition rate. For the subsequent layers the growth rate rises up to a maximum value and then decreases again to zero. Variations on this profile are possible, e.g. the deposition rate may stay at its maximum value during a longer period of time. However, when the substrate is moving fast (which would be the case in a production tool where the substrate may move at a speed above 1 m/min), the rising edge of the deposition rate profile may be too steep to ensure a good control over the growth of the first few monolayers, depending on the process parameters and the tool geometry.

The "double square" dash/dotted line in FIG. 3 shows a theoretical predetermined deposition rate profile for use in a method according to one embodiment. The predetermined deposition rate profile comprises a first predetermined deposition rate range provided to deposit at least one first monolayer of the organic material layer with a first predetermined constant deposition rate onto the substrate and a second deposition rate range provided to deposit at least one second monolayer of the organic material layer with a second predetermined constant deposition rate onto the at least one first monolayer. The first predetermined deposition rate range and first predetermined deposition rate are chosen such that the at least one first monolayer is deposited with a good electrical quality. The second predetermined deposition rate range and second predetermined deposition rate are chosen such that the subsequent monolayers can be deposited at a high linear deposition rate.

The closed dots in FIG. 3 show a realistic asymmetric deposition rate profile that may be well suited for the growth of organic thin films for OTFT applications in a method according to one embodiment. Here the rising edge of the deposition rate profile shows a continuous increase of the deposition rate from zero to a maximum deposition rate. However, this increase is much slower than in the symmetric case shown in FIG. 3 (spaced dots), and therefore it takes a longer time to reach the maximum deposition rate. The decrease of the deposition rate at the trailing edge of the deposition rate profile is much faster and approaches the deposition rate profile at the trailing edge for the case of a symmetric showerhead. Variations on this profile are possible, e.g. the deposition rate may stay at its maximum value during a longer period of time.

In an in-line OVPD system, a predetermined deposition rate profile can be obtained by controlling the spreading of the carrier gas loaded with organic molecules over the substrate, for example by providing a suitable showerhead and deposition chamber geometry.

As an illustrative embodiment of the present invention, an elongated showerhead is further described that gives rise to a predetermined deposition rate profile (on a substrate moving underneath the showerhead in a direction perpendicular to the longitudinal direction of the showerhead) with a slowly rising deposition rate up to a maximum deposition rate, and followed by a relatively fast decreasing deposition rate. Such a deposition rate profile allows slow growth of the first few monolayers, followed by a fast growth of subsequent layers. According to one embodiment, this predetermined deposition rate profile can be obtained by providing a showerhead with a geometry that brings less carrier gas loaded with organic molecules to the substrate at the front edge of the showerhead and more carrier gas loaded with organic molecules at the back edge of the showerhead.

In the example considered, a showerhead comprises a plate located in between the gas mixing chamber 57 and the process chamber 60. The gas mixing chamber is continuously filled with carrier gas loaded with organic molecules coming from upper stages of the furnace. The showerhead plate comprises a plurality of holes or openings through which the gas is injected from the mixing chamber into the process chamber. The mixing chamber is designed in such a way that the process gas partial pressures are the same within the whole mixing chamber. This is preferred because it results in substantially the same partial pressure of process gas at each individual hole of the showerhead plate. The localization and the shape of each hole can be optimized in order to finely control the way the gas is injected into the process chamber.

One of the parameters that can be adapted is the shape of the holes. For example, the holes can have a cylindrical shape (i.e. with a circular cross section in the plane of the showerhead plate) and can extend through the entire thickness of the showerhead plate, the thickness being the size in a direction substantially orthogonal to the plane of the showerhead plate. The holes can be in an orthogonal position, i.e. with the central axis of the cylinder orthogonal to the surface of the plate. The diameter and the depth of the cylinders can be varied in order to control the amount of gas penetrating through each hole. This can for example comprise forming the cylindrical holes with two different diameters: one large diameter at the inlet (upper side) of the showerhead that has no or almost no influence on the gas flow and a smaller diameter at the outlet (lower side) of the showerhead. This smaller diameter has the largest impact on the way the gas is injected into the chamber. Instead of an orthogonal position of the cylindrical holes, the holes can be formed such that the central axis of the cylindrical holes forms a non-zero angle with the orthogonal to the surface of the plate. Other shapes than cylindrical shapes are possible, for example the hole cross section in the plane of the showerhead plate can be a circle, an ellipse, an oval, a square, a triangle, a polygon with straight or curved edges, etc. The cross section of the holes can be constant or it can vary in a direction orthogonal to the plate surface, e.g. the diameter of a hole with a circular cross section can vary in a direction orthogonal to the plate surface, leading to a conical hole. On a plate all holes can be identical or they can be different, e.g. the shape or the size of every individual hole on a showerhead plate can be different.

The holes or openings of the showerhead plate can be located along longitudinal rows, i.e. they can be distributed along straight lines parallel to the longitudinal direction of the showerhead. However, the holes can also be located along rows or lines that have a direction different from the longitudinal direction. A showerhead can comprise several rows. The different rows can be parallel to each other or they can be non-parallel, e.g. they may cross each other. The distance between neighboring rows can be the same over the whole showerhead plate or it can vary over the showerhead plate. In case of parallel rows, a "shift" distance can be provided between rows, the shift distance being a distance by which the holes in one row are displaced along the row direction with respect to the holes in a neighboring row. The number of holes per row can be the same for each row or it can vary from row to row. The total number of holes through the showerhead plate determines the total aperture area of the plate. The total aperture area of the plate determines the pressure drop across the showerhead. On a row, the distance between successive holes can be the same or it can vary.

The organization of the holes within the rows and of the rows themselves can be optimized to control the thickness uniformity of the deposited film, the material utilization efficiency of the system and the deposition rate profile at a given point of the substrate.

The injector used in the in-line deposition system according to one embodiment can be fixed in the in-inline deposition system or can be made interchangeable.

Figure 4:
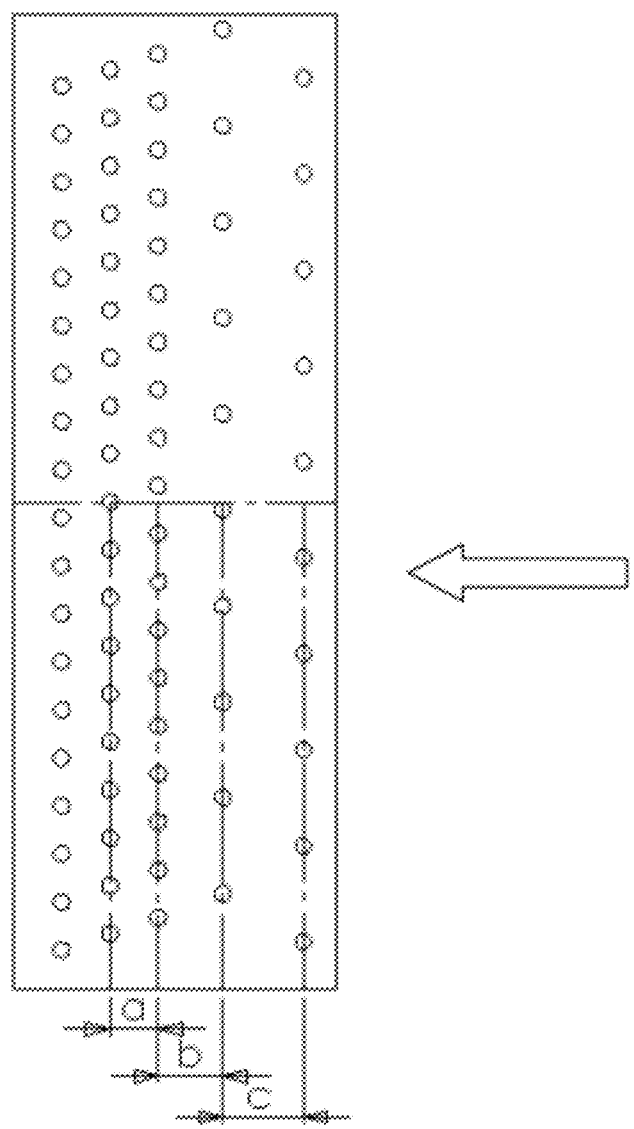
FIG. 4 is a top view of a showerhead according to an embodiment of the present invention.
Figure 5:
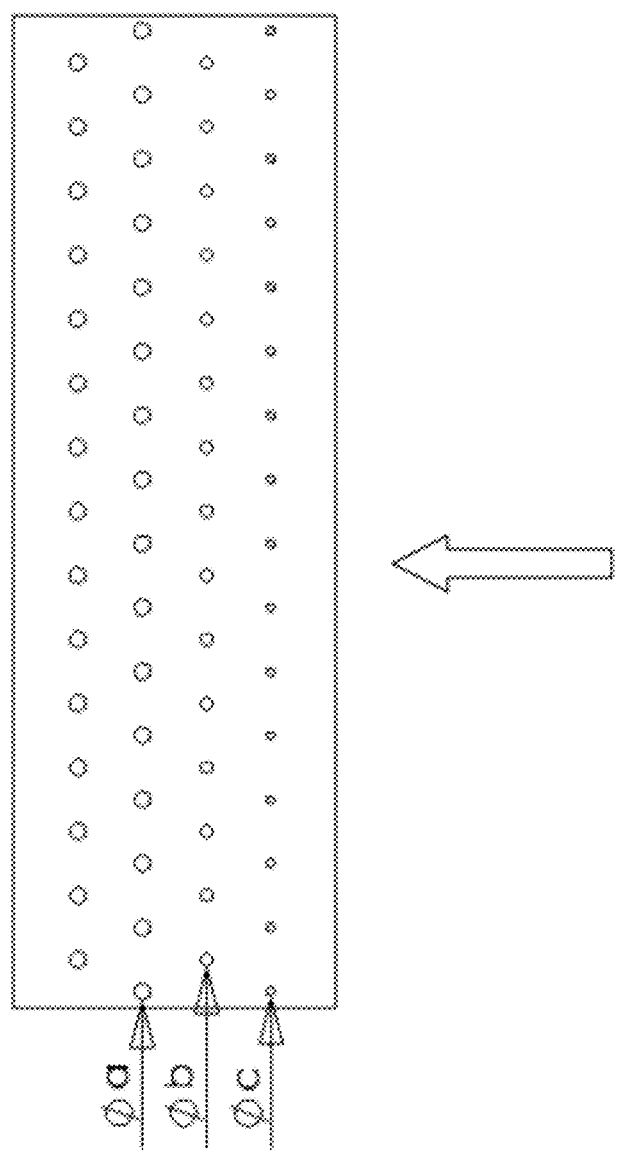
FIG. 5 is a top view of a showerhead according to an embodiment of the present invention.
Figure 6:
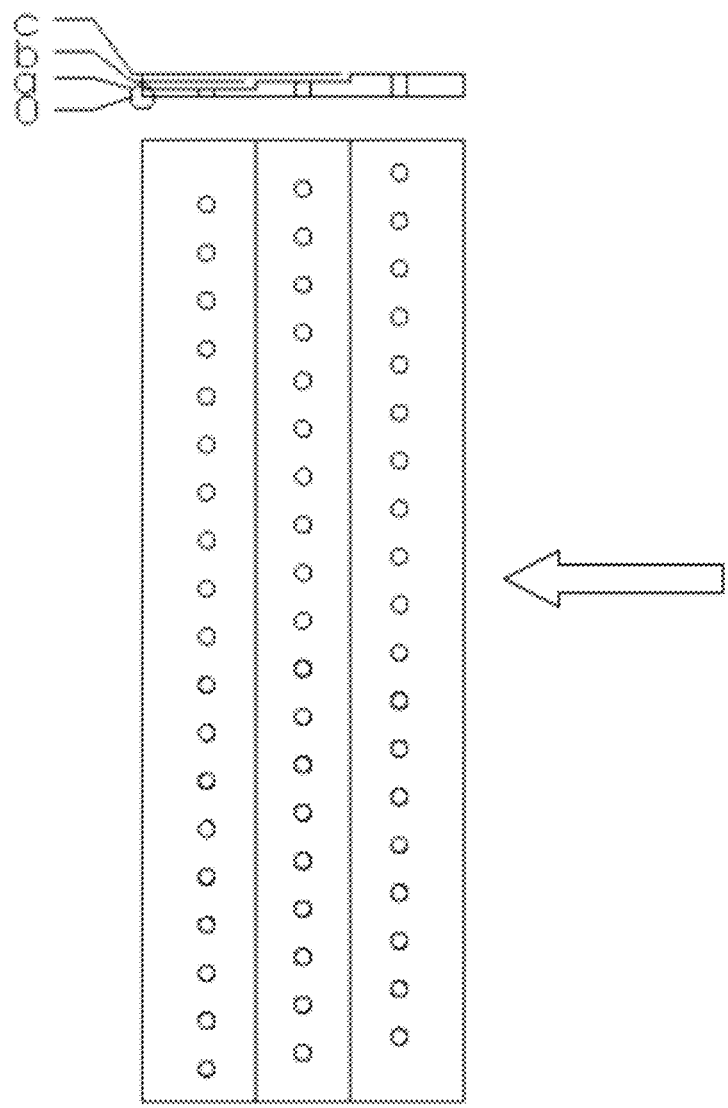
FIG. 6 shows a cross section and a top view of a showerhead according to an embodiment of the present invention.

FIGS. 4, 5 and 6 illustrate three different embodiments of an asymmetric showerhead according to one embodiment. The direction of substrate movement is indicated with an arrow.

FIG. 4 shows a showerhead with substantially parallel rows of holes, the rows being in the longitudinal direction of the showerhead. In the example shown all holes have substantially the same size and within each row the distance between the holes is substantially equal. However, in the first rows (front edge) the distance between the holes within each row is larger than in subsequent rows. In addition the distance between rows is larger at the front edge of the showerhead as compared to the back edge. Variations on the design shown in FIG. 4 can be used, with varying spacing between rows of holes, varying number of holes on a row and varying distribution of holes on a row. Although only circular holes are shown in FIG. 4, other hole shapes can be used or different hole shapes can be combined.

FIG. 5 shows an embodiment with substantially parallel rows of holes, the rows being in a longitudinal direction of the showerhead, wherein the distance between the rows and the distance between the holes within a row are fixed. In this embodiment, the hole diameter is varied from row to row. The smallest holes are provided at the front edge of the showerhead. Also in this embodiment other hole shapes can be used or different hole shapes can be combined.

FIG. 6 shows an asymmetric showerhead with substantially parallel rows of holes, the rows being in a longitudinal direction of the showerhead, wherein the distance between the rows, the distance between the holes within a row and the size of the holes in a plane parallel to the showerhead surface are fixed. In this embodiment the depth of the holes is varied, i.e. the size of the holes in a direction substantially orthogonal to the showerhead surface is varied. Another modification can comprise varying the shape of the holes in a direction substantially orthogonal to the showerhead surface.

Figure 16:
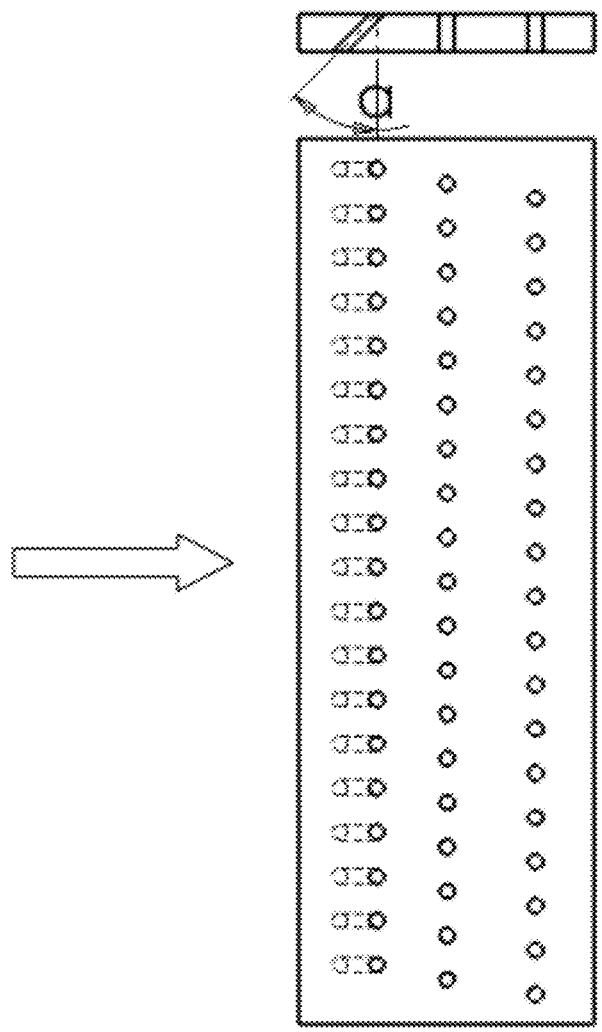
FIG. 16 shows a cross section and a top view of a showerhead wherein the central axis of the holes of the front row forms a non-zero angle with the orthogonal to the showerhead surface.

FIG. 16 shows an asymmetric showerhead with substantially parallel rows of holes, the rows being in a longitudinal direction of the showerhead, wherein the distance between the rows, the distance between the holes within a row and the size of the holes in a plane parallel to the showerhead surface are fixed. In this embodiment the direction of the hole axis is varied and makes an angle to the direction orthogonal to the showerhead plane.

In certain embodiments of the present invention combinations of the features illustrated in FIGS. 4 to 6 and FIG. 16 can be used.

In certain embodiments of the present invention a predetermined deposition rate profile may be realized by adapting geometrical parameters of the OVPD process chamber. In an OVPD deposition system, the process gas injected in the process chamber through the showerhead reaches the substrate on which the organic molecules of the process gas condense. The transport of organic molecules within the carrier gas can be dissociated in two successive stages. The first stage comprises convective transport from the showerhead outlet to the top of the boundary layer (as defined below) that is formed as soon as gas is injected into the process chamber. In convective transport, the movements of the carrier gas strongly determine the movements of the carried organic molecules, i.e. in case of convective transport the organic molecules tightly follow the streamlines of the carrier gas. Therefore, the design of the process chamber is preferably such that it allows finely controlling the flux of carrier gas that brings the molecules where they are needed. The second stage comprises diffusive transport of the organic molecules through the boundary layer. The inert carrier gas forms on top of the cold substrate a boundary layer. This is a region where the carrier gas velocity is substantially lower than at locations further away from the substrate. The organic molecules present in the carrier gas condense on the substrate. Therefore, in the boundary region there is a gradient of organic molecules concentration. At the top of the boundary layer, organic molecules arrive that are convectively transported in the gas flow, and at the bottom of the boundary layer, i.e. at the interface between the gas phase and the solid substrate, the concentration of organic molecules is close to zero. This concentration gradient drives a diffusion process of the organic molecules through the boundary layer. In the boundary layer the diffusive transport of organic molecules dominates. The thickness of the boundary layer has an influence on the deposition rate. The thinner the boundary layer, the more organic molecules can diffuse through the boundary layer and the higher the deposition rate that is obtained. Therefore, the design of the process chamber (and of the showerhead) is preferably such that the formation of a boundary layer can be finely controlled.

Figure 7:
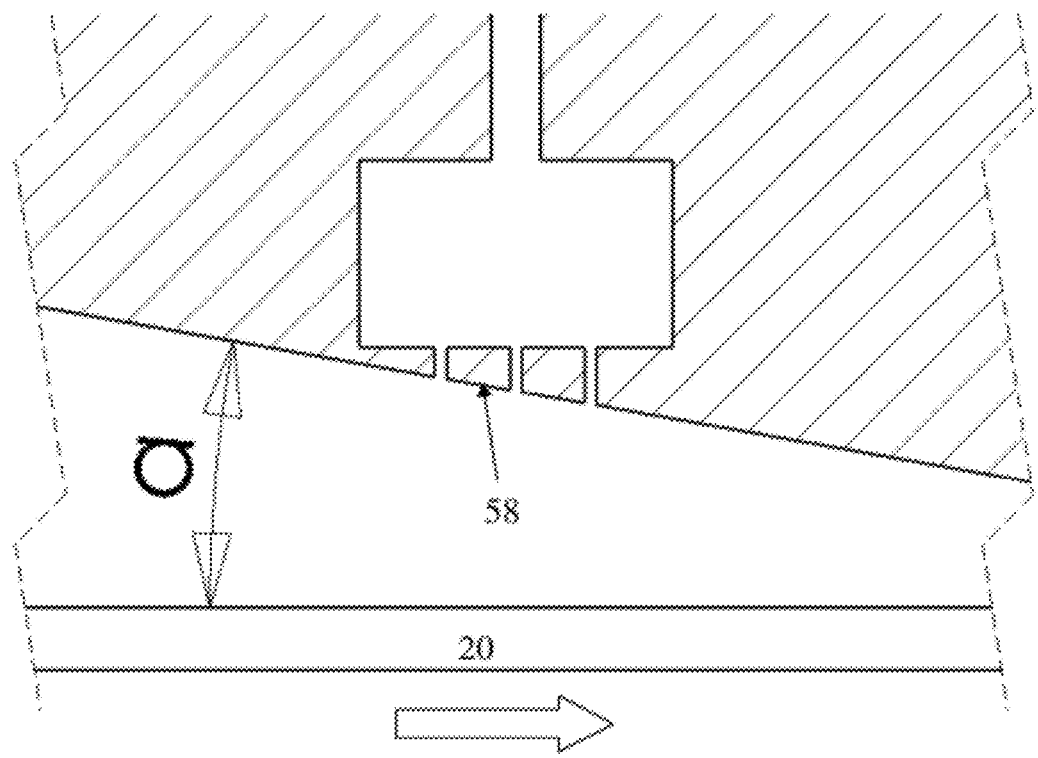
FIG. 7 shows a configuration wherein the showerhead is positioned such that its surface is not parallel with the surface of the substrate.
Figure 8:
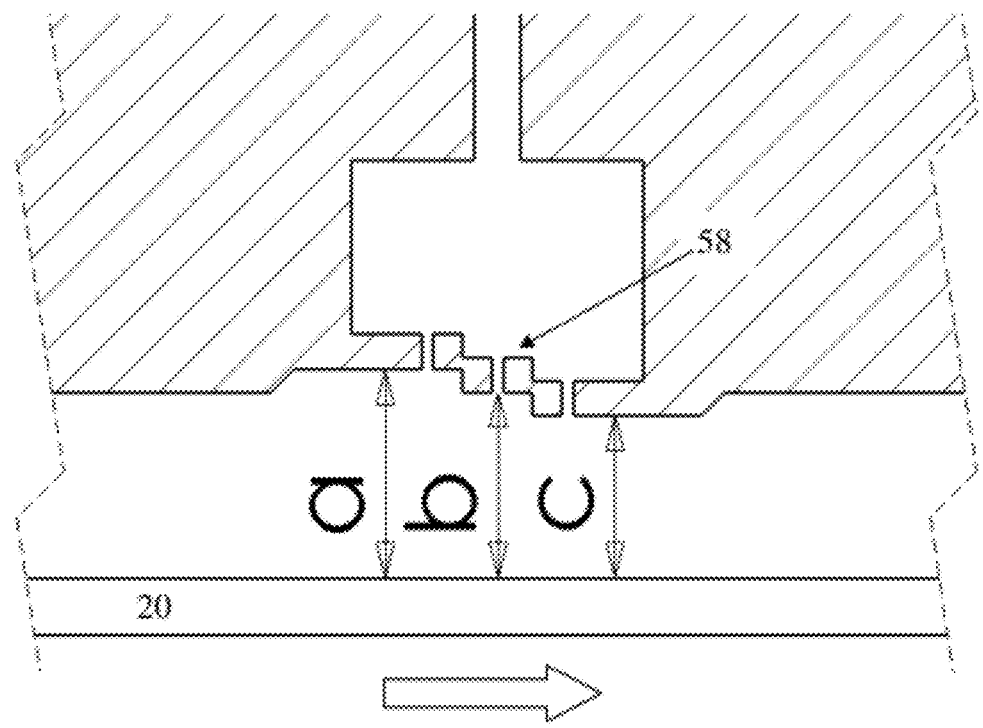
FIG. 8 illustrates a staircase showerhead.
Figure 9:
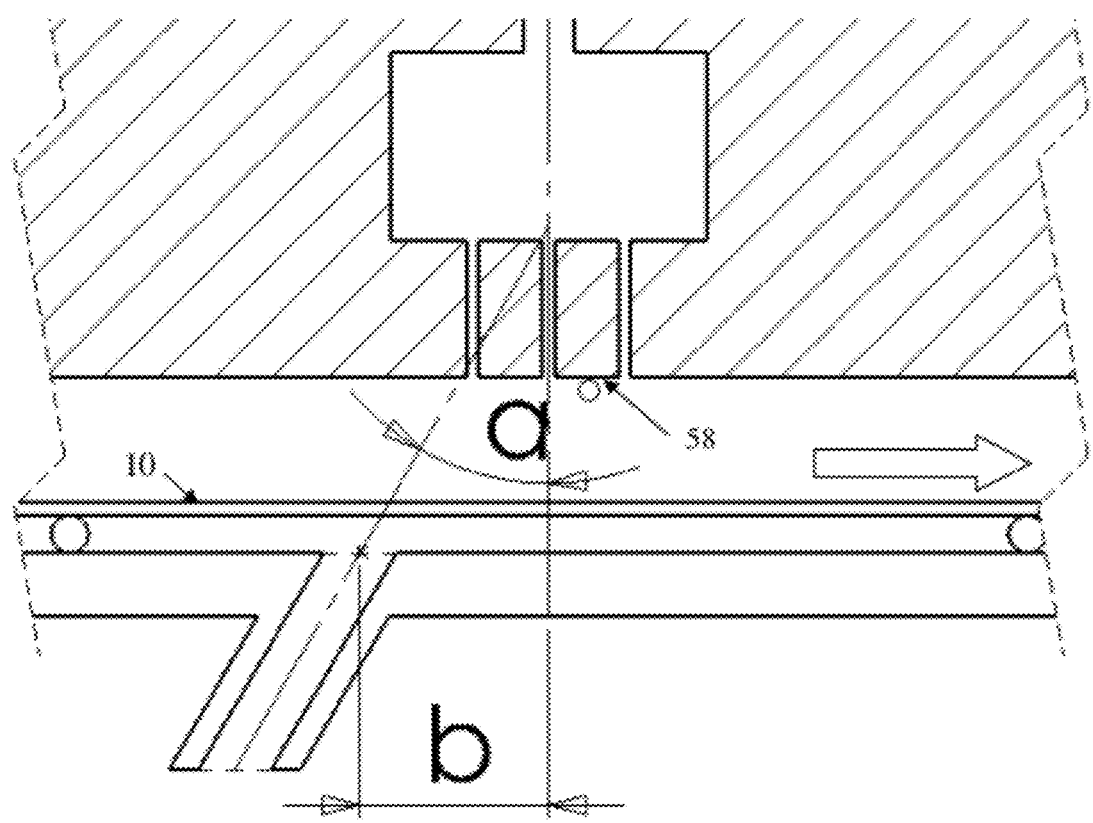
FIG. 9 illustrates an example of a pump port position that can be used for providing an asymmetric deposition rate profile.

Within the process chamber, a plurality of geometrical parameters can be modified. The main geometrical parameters are:

- The distance between the showerhead and the substrate: increasing this distance improves the uniformity, broadens the deposition rate profile but strongly decreases the material utilization efficiency.
- The angle between the showerhead plate and the substrate. For example, the showerhead 58 can be positioned such that its surface is not parallel with the surface of the substrate 20 but at an angle with the surface of the substrate, such that e.g. the distance (a) between the showerhead 58 and the substrate 20 is larger at the front edge of the showerhead than at the back edge of the showerhead. Such a configuration is schematically illustrated in FIG. 7. The arrow indicates the direction of substrate movement.
- The shape of the showerhead plate can be non-planar. For example, a "staircase" linear showerhead can be provided along each step of which is a row of holes. In this case the distance (a, b, c) between the showerhead 58 and the substrate 20 changes step-wise in the direction of substrate movement. A staircase showerhead is illustrated in FIG. 8. The arrow indicates the direction of substrate movement.
- The pump port(s) position. Mainly the position of the pump port(s) along the direction of the movement of the substrate influences the deposition rate profile. An example of a pump port position that can be used for providing an asymmetric deposition rate profile is shown in FIG. 9. The arrow indicates the direction of substrate movement.
- Other elements can be adapted or provided for controlling the spreading of gas over the substrate surface. For example: adding walls of predefined geometry that extend between the showerhead surface and a position very close to the substrate surface, thereby leaving a very small gap between the substrate and the wall bottom edge. One such wall could be placed along the front edge of the showerhead. Another such wall could be placed along the back edge.

In certain embodiments of the present invention combinations of different features, chamber geometries and showerhead variations can be used.

Simulations of the deposition rate profile of an in-line OVPD system were performed, illustrating the influence of the showerhead design and of a number of geometrical parameters of the OVPD process chamber. The calculations were carried out by finite element analysis using the COMSOL Multiphysics software. Carrier gas fluid dynamics were taken into account using an incompressible Navier-Stokes model. The carrier gas temperature was calculated using heat transport based on a conduction and convection model. Injection of the organic molecules into the carrier gas flow was modeled using a diffusion and convection model for the transport of a diluted phase. The physical characteristics of the model were kept constant throughout all simulations. More in particular, the gas and wall temperatures were kept constant, the gas inlet mass flow and outlet pressures were assumed to be constant, the organic molecules flux at the inlet, their diffusion coefficient and their condensation rate on the substrate were kept constant. Only the geometry of the model was modified in order to study the effect of geometry variations on the deposition rate profile. The deposition rate profile was extracted from the simulation results by dividing the total normal flux of organic molecules condensing on the substrate by the material density.

The geometry of the model comprises a mixing chamber at the top of which is a gas inlet and at the bottom of which is a showerhead plate. The showerhead plate is provided with a number of parallel rows of holes that were assumed to have a cylindrical shape, the rows being oriented in the longitudinal direction of the showerhead. The process gas is injected through the holes onto a substrate. It is assumed that the size of the substrate in a direction corresponding to the direction of substrate movement is large compared to the other dimensions of the system. This simulates an infinitely long substrate typical for a reel-to-reel system. The deposition rate was calculated as a function of the position along a static substrate (in a direction orthogonal to the longitudinal direction of the showerhead), delivering an image of the deposition rate profile. Assuming a constant substrate velocity in practical applications, there is a direct relation between the spatial deposition rate profile on a static substrate and the temporal deposition rate profile on a moving substrate.

Figure 10:
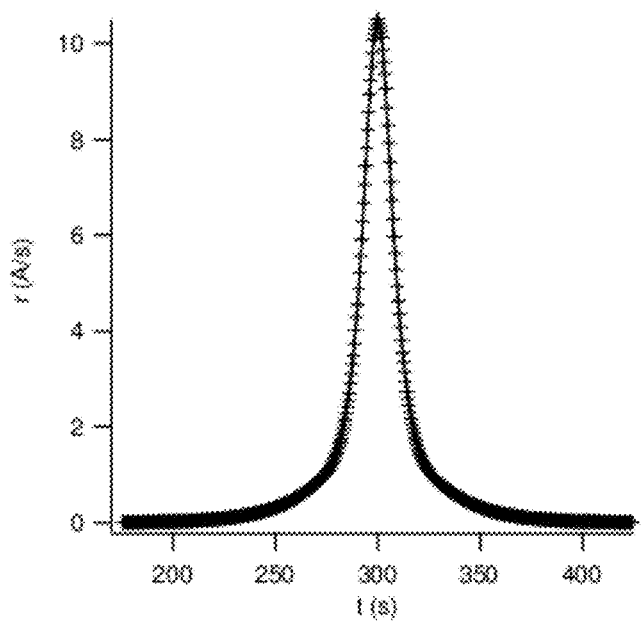
FIG. 10 shows the simulated deposition rate profile for an in-line deposition system with a showerhead comprising one row of holes.

FIG. 10 shows the deposition rate profile for the case of a showerhead comprising one row of holes in a symmetric system. The peak of this deposition rate profile is best fitted with a Lorentzian fitting function, which is a typical distribution function for a collisional broadening phenomenon. The result shown in FIG. 10 can be considered as a reference. Indeed, each row of holes in a showerhead will give rise to a peak similar to the one shown in FIG. 10. Therefore, the overall deposition rate profile can be considered as a superposition of individual deposition rate profiles similar to the one shown in FIG. 10.

Figure 11:
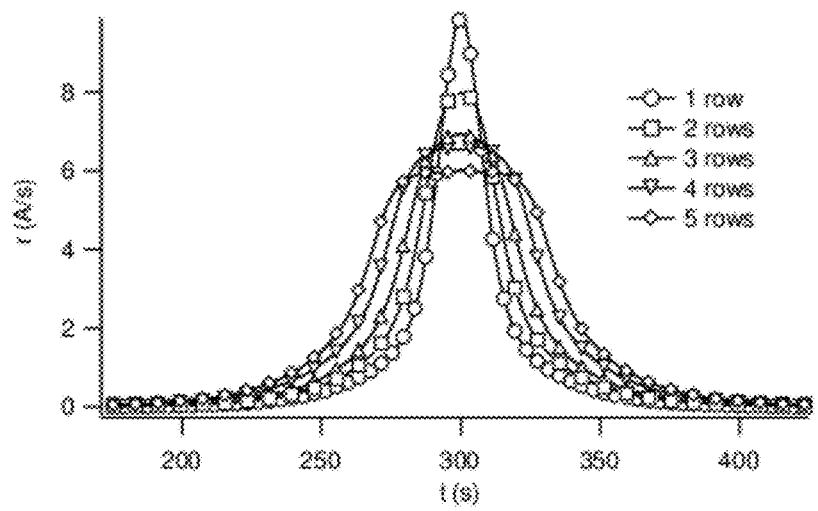
FIG. 11 shows simulated deposition rate profiles for symmetric showerhead with different numbers of rows of holes.

FIG. 11 shows deposition rate profiles for symmetric showerheads with increasing number of parallel rows of holes (from 1 row to 5 rows). It can be seen that when increasing the number of rows, the deposition peak is broadening and the maximum deposition rate decreases. In this simulation, the total aperture area of the showerhead is kept constant in order to keep a constant pressure drop across the showerhead. This means that the holes in the one-row case have a larger diameter than in the five-rows case.

Figure 12:
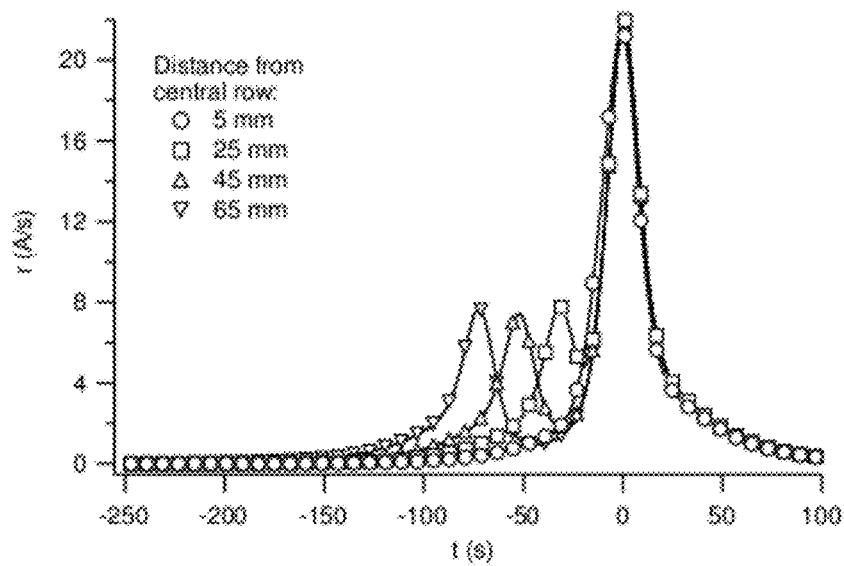
FIG. 12 shows simulated deposition rate profiles for a showerhead with three rows of holes, for varying distance between the front row and the central row.

FIG. 12 shows the effect on the deposition rate profile of increasing the distance between the front row of holes (i.e. the row of holes located closest to the front edge of the showerhead) and the central row of holes for a showerhead with three parallel rows of holes. Curves are shown for a distance ranging from 5 mm to 65 mm, with a step of 10 mm. The distance between the central row of holes and the back row of holes (i.e. the row of holes closest to the back edge of the showerhead) is assumed to be 5 mm. It can be seen that the individual deposition rate peak related to the front row moves with increasing distance between the front row and the central row.

Figure 13:
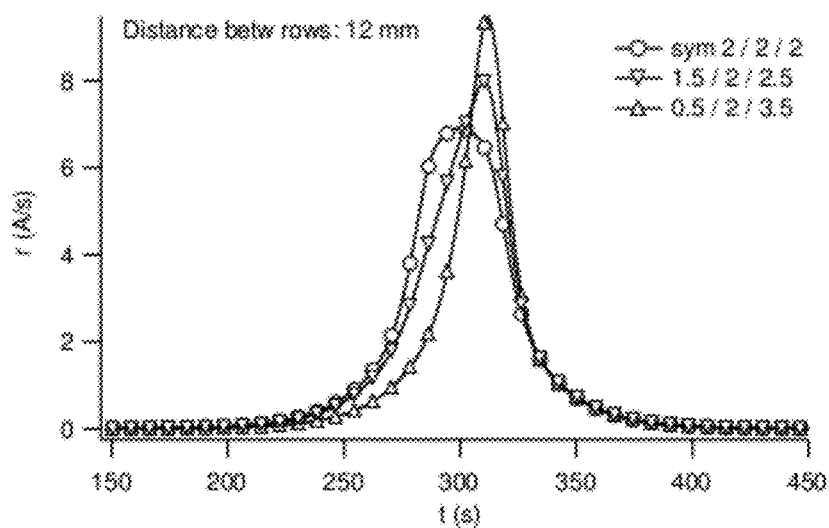
FIG. 13 shows simulated deposition rate profiles for a showerhead with three rows of holes and with varying hole diameters for the different rows.

FIG. 13 shows the simulated deposition rate profiles for a showerhead with three parallel rows of holes wherein the hole diameter is varied. The red curve shows the symmetric case where all of the holes have the same diameter (2 mm). Successive curves show an asymmetric modification of the profile wherein the diameter of the holes of the front row is reduced (in the range from 1.75 to 0.5 mm) and wherein the diameter of the holes of the back row is increased (in the range from 2.25 to 3.5 mm). The diameter of the holes of the central row is assumed to be 2 mm and the distance between the rows is 12 mm. It can be seen that a showerhead with smaller holes at the front row and larger holes at the back row leads to an asymmetric deposition rate profile with a rising edge that is less steep than the trailing edge.

Figure 14:
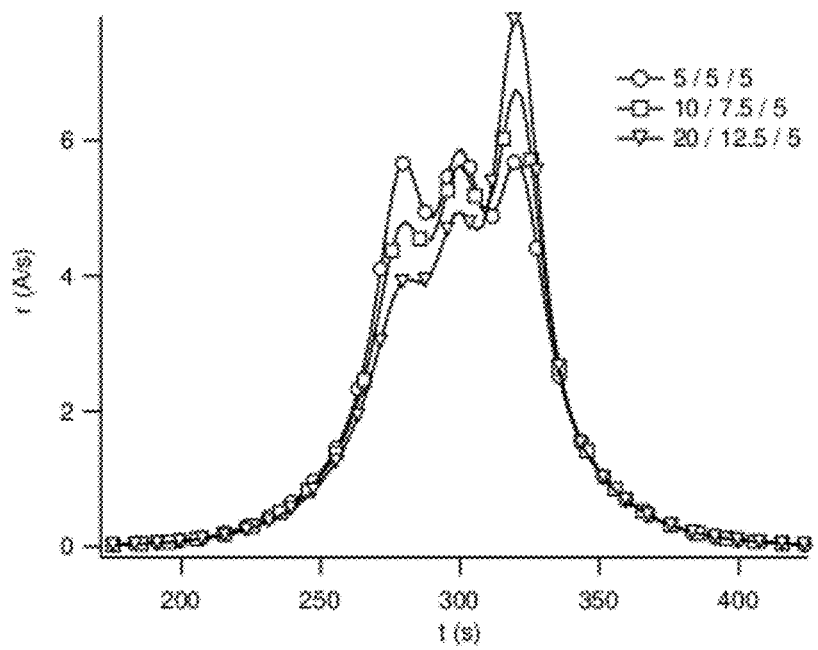
FIG. 14 shows simulated deposition rate profiles for a showerhead with three rows of holes and with varying hole depth.

FIG. 14 shows the effect on the deposition rate profile of a modification of the hole depth of a showerhead comprising three rows of holes. The red curve shows the symmetric case where all the holes of the three rows have the same depth (5 mm). The spacing between successive rows is assumed to be relatively large, i.e. 20 mm. This renders the presence of three individual peaks (corresponding to the three rows of holes) more visible. In FIG. 14, successive curves show what happens when the depth of the two first rows holes is increased. The depth of the holes of the front row is increased by successive increments of 5 mm while the depth of the holes of the central rows increases by increments of 2.5 mm. De depth of the holes of the back row is assumed to be 5 mm for all cases. Increasing the depth of a hole lowers the flow through that hole or aperture. Therefore the deposition rate underneath a deeper hole tends to decrease. However, in case of a constant total mass flow (as assumed in the simulations), the flow through the row with shallow holes increases. This is the reason why in FIG. 14 the individual peak related to the back row increases even though the depth of its holes is the same. It can be seen that a showerhead with decreasing hole depth in the direction of substrate movement leads to an asymmetric deposition rate profile with a rising edge that is less steep than the trailing edge.

Figure 15:
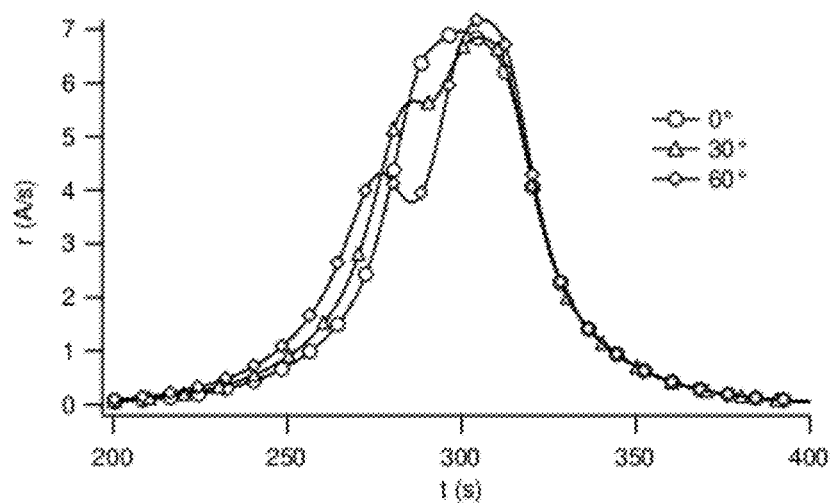
FIG. 15 shows simulated deposition rate profiles for a showerhead with three rows, wherein the orientation of the holes of the front row is varied.

FIG. 15 shows the deposition rate profile for a showerhead with three rows of holes wherein a central axis of the holes of the front row makes a non-zero angle with the orthogonal to the surface of the showerhead plate. A top view and a cross section of such a showerhead is shown in FIG. 16. The arrow indicates the direction of substrate movement. The 0° curve in FIG. 15 shows the symmetric case where all holes have their central axis orthogonal to the surface of the showerhead plate. Successive curves show the deposition rate profiles for the case where the central axis of the holes of the front row forms a non-zero angle (15° to 60°) with the direction orthogonal to the surface of the showerhead plate. It is assumed that the holes are rotated around an axis parallel to the longitudinal direction of the showerhead and in a direction opposite to the direction of substrate movement. Under such an angle, the gas is injected towards the coming substrate. It can be concluded from the results shown in FIG. 15 that such a rotation causes a widening of the rising edge of the deposition rate profile and a shoulder appears at this rising edge.

Figure 17:
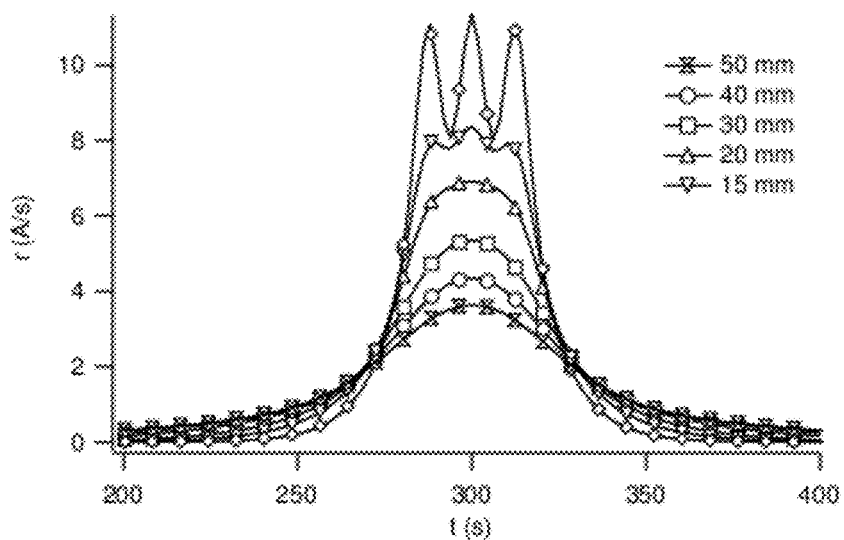
FIG. 17 shows simulated deposition rate profiles for varying distance between the showerhead and the substrate.

FIG. 17 shows the evolution of the deposition rate profile when the distance between the showerhead and the substrate is varied from 10 mm to 50 mm, with steps of 5 mm. The showerhead is assumed to be symmetric with three rows of holes. Increasing the distance between the showerhead and the substrate leads to a widening of the deposition rate profile. Moreover, when the distance becomes sufficiently short, the individual peaks related to each row become clearly visible. Finally, judging by the area under each profile, the material utilization efficiency increases when the distance between the showerhead and the substrate is decreased.

Figure 18:
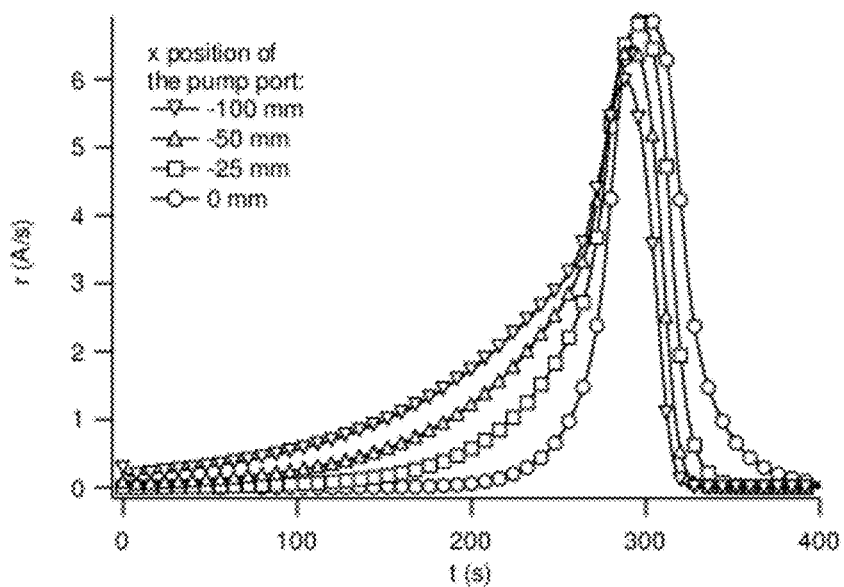
FIG. 18 shows simulated deposition rate profiles for different positions of the pump port.

FIG. 18 shows the effect on the deposition rate profile when a single pump port moves from a location opposite to the center of the showerhead towards the front edge of the showerhead. The red curve shows the symmetric case, wherein the pump port is located opposite to the central row of the symmetric showerhead. Successive curves show that moving the pump port to the front edge of the showerhead strongly influences the deposition rate profile, rendering it more and more asymmetric. The reason for this effect is the modification of the carrier gas flow lines in the process chamber. Gas streamlines flow in the direction of the pump port and are therefore deviated towards the front edge of the showerhead. The convectively transported organic molecules follow the same path and deviation. Many options exist regarding the position of the pump port(s). In general, in order to increase the asymmetry of the deposition rate profile, the pump port(s) is/are preferably placed such that the carrier gas flow is deviated towards the front edge of the showerhead. However, this could present some challenge in case of wide substrates (i.e. with a large size in a direction perpendicular to the direction of substrate movement), since in such case it may be difficult to keep the same deviation of the streamlines along the whole width of the substrate.

Figure 19:
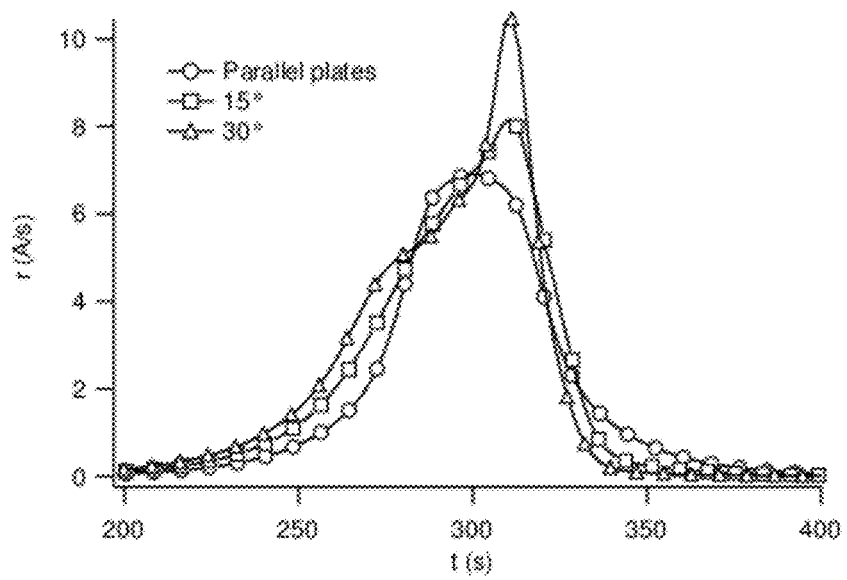
FIG. 19 illustrates the effect of a variation of the angle between the showerhead plate and the substrate on the deposition rate profile.

FIG. 19 shows the effect on the deposition rate profile of a variation of the angle between the showerhead plate and the substrate. The red curve shows the deposition rate profile for the case where the surface of the showerhead is parallel with the substrate surface. The other curves show the deposition rate profile for the case with a non-zero angle (15° and 30°) between the showerhead surface and the substrate surface. It can be seen that increasing this angle leads to an asymmetric deposition rate profile.

An alternative thin-film deposition technique that may be used for depositing organic layers is vacuum thermal evaporation or OMBD. This technique can successfully be adapted to an in-line system geometry, using a substrate moving linearly in a direction substantially orthogonal to an elongated evaporation source. The main difference with OVPD is in the absence of a carrier gas that strongly influences the movements of the transported organic species. In OVPD, the process gas can be considered as a continuum and its flow can be modelled using Navier Stokes equations. In OMBD, because of the long mean free path of the organic molecules, the organic gas can no longer be treated as a continuum. Its flow is solved using the principles of molecular mechanics. Despite this, it is also possible to predetermine the deposition rate profile in an in-line OMBD system.

In an OMBD process, the functioning of the evaporation source can be split into two stages: the generation of vapor by sublimation of source material and the effusion of this vapor into the deposition chamber. There are different ways to organize the succession of these two stages:

Both stages can occur simultaneously, i.e. the vapor can be generated directly into the deposition chamber.

Both stages can directly follow each other. In this case the vapor is generated in an effusion chamber that is separated from the main deposition chamber by a plate pierced with apertures. The vapor is injected into the deposition chamber through these apertures.

Both stages can be physically separated. The vapor can be generated in an evaporation chamber. It diffuses from this evaporation chamber to an effusion chamber separated from the main deposition chamber by a plate with apertures. The vapor is injected into the deposition chamber through these apertures. The path between the evaporation chamber and the effusion chamber can be a simple baffle or it can have a more complex geometry.

Controlling the deposition rate profile in such a system is not directly related to the way the vapor is generated but rather to the way the organic molecules are injected into the deposition chamber. Therefore, only the geometry of the plate with apertures separating the effusion chamber from the main deposition chamber is considered here. It is assumed that the effusion chamber is homogeneously filled with the vapor of source material, independently of the way it is generated.

Figure 20:
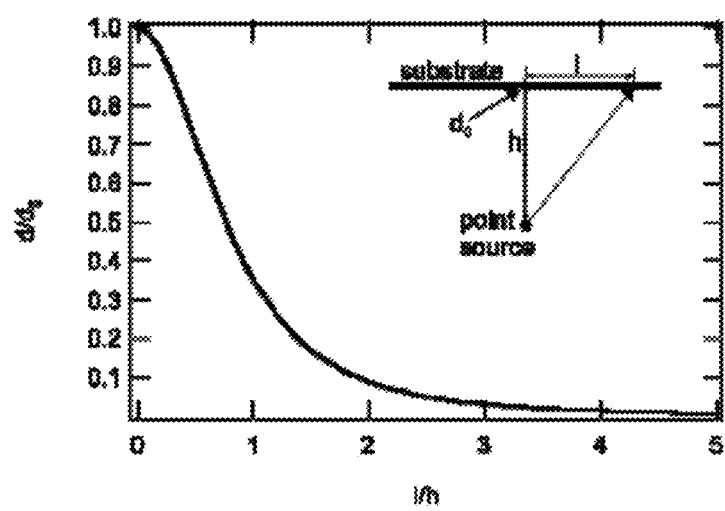
FIG. 20 illustrates the layer thickness distribution as a function of the position on a substrate relative to a point evaporation source.

A consequence of the cosine law of emission describing vacuum evaporation is the mathematical description of the radial layer thickness (d) distribution as a function of the position on a substrate relative to a point evaporation source:

$$\frac{d}{d_0} = \left[1 + \left(\frac{l}{h}\right)^2\right]^{-\frac{3}{2}}$$

wherein l is the radial distance from the point source, h is the vertical distance from the point source and $d_0$ is the thickness underneath the point source, i.e. at zero radial distance from the point source (l=0). This relation and a schematic representation of the considered geometry are depicted in FIG. 20. Since the deposition rate r is directly proportional to the final thickness d, this relation defines a spatial deposition rate profile r(x). Using a point source cell, the deposition rate at a given position on a substrate is less than 10% of the rate at a position on the substrate underneath the point source when l/h>2.

In a real evaporation source, each aperture in the plate separating the effusion chamber from the deposition chamber can be considered as a plurality of point sources located side by side. The final deposition thickness is then the superimposed effect of each point source cell. Therefore, the final spatial deposition rate r(x) is the superimposition of the profiles generated by each point source.

Figure 21:
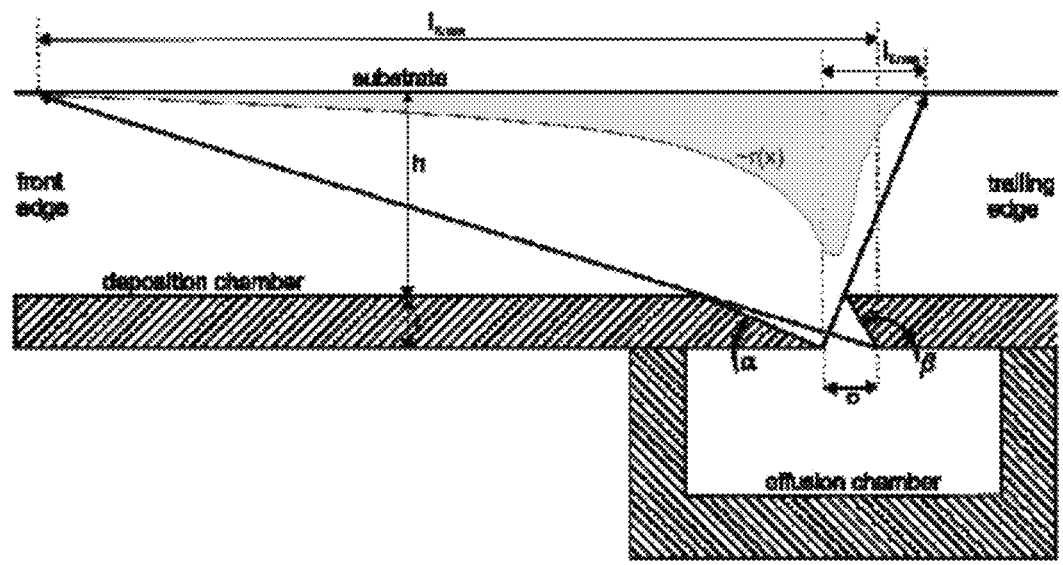
FIG. 21 illustrates an aperture geometry of an in-line OMBD deposition system.

As a consequence, one can control the shape of the spatial deposition rate profile r(x) by carefully selecting the geometry of the aperture and distance h between the plate and the substrate. FIG. 21 shows a cross section of an aperture geometry that is designed to deliver an asymmetric deposition rate profile. In the example shown, the edges of the aperture are cut with angles α<90° for the front edge and β>90° for the trailing edge. This cut allows for a precise control over the maximum lateral distance which can be reached by the molecular flow. $l_{F,max}$ is the maximum distance reachable at the front edge of the profile while $l_{T,max}$ is the maximum distance reachable at the trailing edge of the profile. These are graphically defined in FIG. 21. One can show that:

$$\frac{l_{F,max}}{h+t} = \frac{o}{t} + \frac{1}{tg(\alpha)}$$

$$\frac{l_{T,max}}{h+t} = \frac{o}{t} - \frac{1}{tg(\pi - \beta)}$$

wherein t is the plate thickness and o is the aperture bottom opening.

As can be seen from FIG. 20, a progressively increasing asymmetric deposition rate profile is given by a large $l_{F,max}$/(h+t). This can be obtained with a large o, a small t and a small α. A sudden drop of the deposition rate on the trailing edge corresponds to a small $l_{T,max}$/(h+t). This can be obtained with a small o, a large t and a large β.

A corresponding spatial deposition rate profile r(x) is schematically shown in FIG. 21, illustrating how this aperture shape can deliver such an asymmetric deposition rate profile. The real profile can be obtained by integrating the point source expression along the bottom opening of the aperture, taking into account the evolution of the limits $l_F$ and $l_T$ with the position. By moving the substrate at a constant velocity from left (front side) to right (trailing side) in FIG. 21, the spatial deposition rate profile r(x) can be changed into a temporal deposition rate profile r(t) with an equivalent shape.

FIG. 21 presents an example of a geometry that may be used to control the deposition rate profile in an in-line OMBD deposition system. Other geometries of the plate with apertures and of the deposition chamber can be used in order to reach the same goal, i.e. to realize a predetermined deposition rate profile. For example, in FIG. 21, the plate with apertures is parallel to the plane of the substrate. However, by providing a non-zero angle between the plate and the substrate, it is possible to vary the chamber height h. Alternatively or in addition, the plate with apertures could be replaced by a superimposition of thinner plates with apertures. The distance between successive plates, the aperture shapes and their relative position from plate to plate can be carefully controlled in order to obtain an effect similar to the one described in relation with FIG. 21.

In this description, the third dimension, along the longitudinal edge of the elongated source (longitudinal direction), has not been taken into account. The design of the apertures along that direction may not affect the deposition rate profile. It only affects the thickness uniformity along this longitudinal direction. Therefore, it may be designed according to other constraints, such as the way the effusion chamber is filled with the generated vapor.

Experiments

Figure 22:
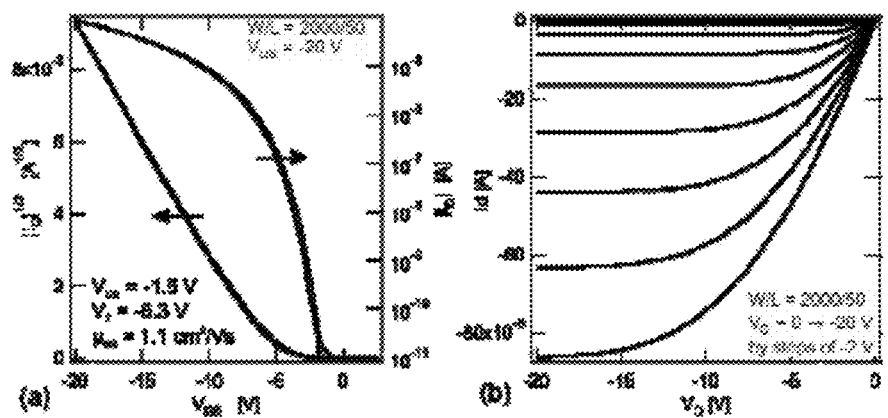
FIG. 22 shows characteristics of a typical top contact OFET based on an in-line OVPD-deposited pentacene thin film formed by a method according to one embodiment: (a) Output curve. (b) Transfer curve measured in saturation.

FIGS. 22(a) and 22(b) show a typical output and transfer curves measured on a top-contact OFET based on an in-line OVPD-deposited pentacene thin film. The deposition rate profile was a symmetric profile with a slow increase of the deposition rate in the beginning (rising edge) and a slow decrease at the end (trailing edge); thereto a symmetric showerhead was used and the distance between the showerhead and the substrate was increased to broaden the deposition profile (as illustrated in FIG. 17). The transistor characteristics show a $V_{ON}$ close to 0V. The steep subthreshold slope (<0.4 V/dec) and the negligible hysteresis indicate a high purity and low trap density. The saturation mobility of this device is 1.01 cm$^2$/Vs.

Figure 23:
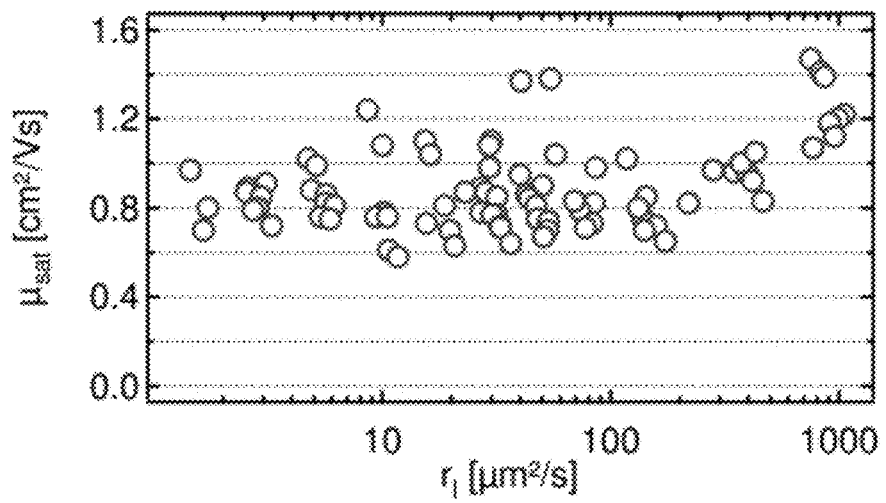
FIG. 23 shows the saturation mobility vs. linear deposition speed measured on 85 different samples of an in-line OVPD-deposited pentacene thin film formed by a method according to one embodiment.

Such OFET characteristics were observed on most of the pentacene films prepared with the in-line OVPD according to one embodiment and they appear to be quite independent of the linear deposition speed of the pentacene film. This is visible in FIG. 23 that shows the top contact TFT saturation mobilities measured on 85 different samples versus the linear deposition speed of their pentacene film. All mobilities are between 0.6 and 1.5 cm$^2$/Vs. This spread can mainly be explained by the effect of other deposition conditions such as substrate temperature and chamber pressure, which were not equal for all experiments. As can be seen in FIG. 23, transistor characteristics remain excellent, even at the highest growth speeds.

Figure 24:
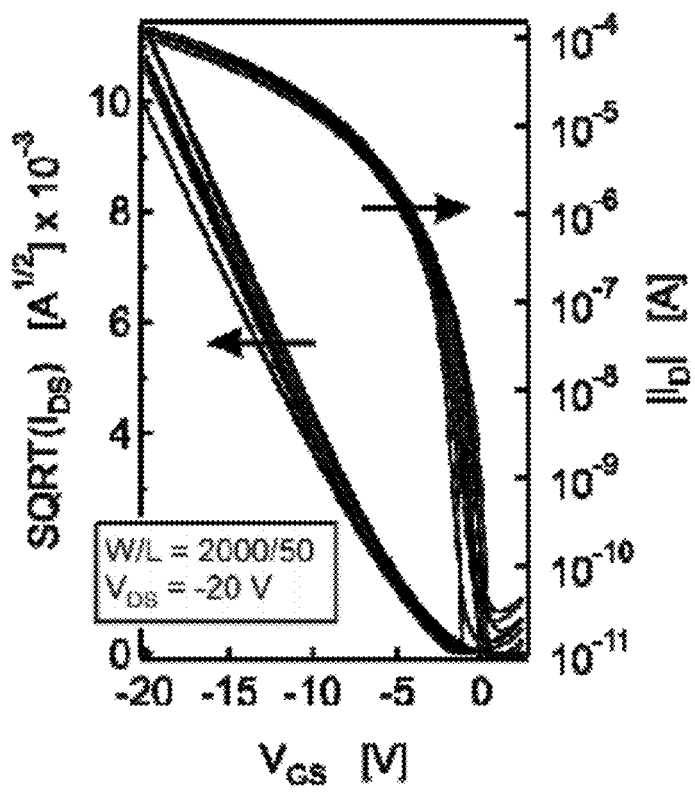
FIG. 24 shows superimposed transfer curves of 7 transistors measured on the same wafer with a pentacene film deposited at a linear deposition speed of 910 micrometer$^2$/s.

FIG. 24 represents superimposed transfer curves measured on seven different transistors prepared on one substrate on which pentacene was grown with a linear deposition speed of 910 µm$^2$/s corresponding to an average deposition rate of 91 A/s. They have a mobility µ=1.11±0.07 cm$^2$/Vs, a threshold voltage $V_T$=−4.6±0.2 V, an onset voltage $V_{ON}$=−0.8±0.6 V. The small standard deviations show a good reproducibility of OFETs fabricated on a same wafer coated with pentacene grown at very high speed. These characteristics show that pentacene thin films deposited with an in-line OVPD system according to one embodiment meet the requirements to fabricate organic circuits. This observation is counter-intuitive, since it is generally accepted in the field that an increase of deposition rate usually comes with a worsening of the electrical characteristics. Indeed, an increase of deposition rate yields a higher grain nucleation density during the formation of the first pentacene monolayer on the dielectric. This leads to an unfavorable morphology of this monolayer, which is essential for the transport of charge carriers in OFETs. In the method according to one embodiment, these first monolayers are formed at low deposition rate. This slow formation of the first monolayers, even when growing at very high speeds, is the key to the good electrical performance of pentacene films grown according to a method in accordance with one embodiment.

Figure 25:
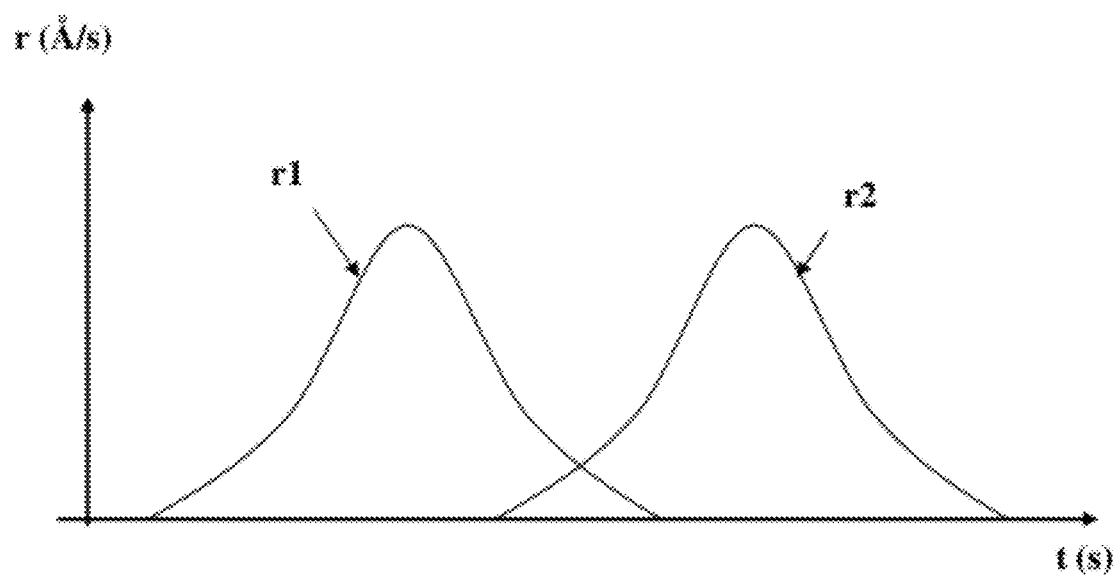
FIG. 25 shows two successive deposition rate profiles that partially overlap.

In one embodiment, two (or more) linear showerheads can be provided successively in the direction of substrate movement, wherein a first material is provided through a first showerhead and wherein a second material (e.g. different from the first material) is provided through a second showerhead. By adapting properties of the successive showerheads and/or of the chamber, it is possible to obtain two successive deposition rate profiles that are partially overlapping. This is schematically illustrated in FIG. 25.

Such an approach can for example advantageously be used in a fabrication process for OLEDs. In OLED structures, the recombination zone (where both charge carriers radiatively recombine) can be very narrow, located at a sharp interface between, for example, a hole transport layer (HTL) and an emission layer (EL). In order to improve the characteristics of OLEDs based on small-molecular weight organic semiconductors, the recombination zone can be broadened, e.g. by replacing the sharp interface by a region comprising a mixture of the two materials adjacent to the recombination zone. It has been shown that this approach can strongly increase OLED efficacy and lifetime.

For example, it was reported by F. Lindla et al in "Layer cross-fading at organic/organic interfaces in OVPD-processed red phosphorescent organic light emitting diodes as a new concept to increase current and luminous efficacy", Mater. Res. Soc. Symp. Proc. Vol. 1154, 2009, which is incorporated herein by reference in its entirety, that a broader recombination zone can be formed by means of OVPD. More in particular, a cross-fade zone can be formed, where the concentration of a first material decreases while the concentration of a second material increases. Using OLED structures comprising such cross-fade zone, a great increase in the device efficacy was demonstrated. For fabricating the OLED structures a static OVPD system equipped with one showerhead was used. In order to realize the cross-fade zone, the required materials where co-deposited while progressively modifying their respective concentrations in the process gas by finely tuning the amount of carrier gas flowing through each individual source cell containing the powder of material to be deposited. This technique requires very stable organic fluxes and an excellent gas flow control.

In one embodiment, an in-line OVPD reactor can be equipped with two successive showerheads, for example each showerhead providing a deposition rate profile with a slow rising edge and a slow trailing edge. A first material can be provided through the first showerhead leading to a first deposition rate profile r1 for the first material, and a second material can be provided through the second showerhead leading to a second deposition rate profile r2 for the second material. The configuration of the showerheads and/or the chamber geometry can be carefully selected such that there is a partial overlap (superposition) of the respective deposition rate profiles r1 and r2 of each showerhead, as illustrated in FIG. 25. A substrate moving at a constant speed under successive showerheads providing such deposition rate profiles would get coated with a double layer structure having a cross-faded interface. Further layers can be added on the structure by simply adding more showerheads upstream and/or downstream along the process line. Each showerhead then provides only one material (or a constant blend of two materials). This approach can advantageously be used for forming OLED structures with a cross-fade zone. This solution allows building reproducibly complex multilayer structures. Moreover, it is completely roll-to-roll compatible, reduces thermal load problems on the wafer and cross-contamination problems between sources.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming an organic material layer with a layer thickness on a substrate in an in-line deposition system, the method comprising:
   depositing an organic material with a predetermined deposition rate profile through a plurality of openings of an injector onto a substrate, the injector being in relative movement with respect to the substrate,
   wherein the predetermined deposition rate profile is a non-constant deposition profile which comprises a first deposition rate range provided to deposit at least one first monolayer of the organic material layer with a first predetermined average deposition rate onto the substrate and a second predetermined deposition rate range provided to deposit at least one second monolayer of the organic material layer with a second predetermined average deposition rate onto the at least first monolayer provided on the substrate, the first average deposition rate being smaller than the second average deposition rate, and wherein the injection of organic material through the openings of the injector towards the substrate is controlled for realizing the predetermined deposition rate profile.

2. The method according to claim 1, wherein the predetermined deposition rate profile comprises a first predetermined average deposition rate below about 0.1 nm/s and a second predetermined average deposition rate higher than about 1 nm/s.

3. The method according to claim 1, wherein the predetermined deposition rate profile comprises an asymmetric deposition rate profile.

4. The method according to claim 3, wherein the predetermined deposition rate profile has a rising edge and a trailing edge, wherein the trailing edge is substantially steeper than the rising edge.

5. The method according to claim 1, wherein a gas carrying the organic material is provided through the plurality of openings of the injector, and wherein the injection of organic material through the openings of the injector is controlled by controlling a gas flow of the carrying gas.

6. The method according to claim 5, wherein controlling the gas flow towards the substrate comprises adapting a geometrical parameter of a process chamber of the in-line deposition system.

7. The method according to claim 6, wherein adapting a geometrical parameter comprises adapting a distance between the injector and the substrate.

8. The method according to claim 6, wherein adapting a geometrical parameter comprises adapting an angle between a surface of the substrate and a surface of the injector.

9. The method according to claim 6, wherein adapting a geometrical parameter comprises adapting the location of a pump port.

10. The method according to claim 1, wherein controlling the injection of organic material through the injector comprises adapting a parameter of at least part of the plurality of openings of the injector.

11. The method according to claim 10, wherein adapting a parameter comprises adapting the size, the shape, the orientation, the depth and/or the location of at least a part of the plurality of openings.

12. The method according to claim 10, wherein adapting a parameter comprises adapting a distance between at least a part of the plurality of openings.

13. The method according to claim 1, wherein the organic material comprises an organic semiconductor material.

14. A process for forming an organic thin film transistor, the method comprising forming an organic material layer with a layer thickness on a substrate in an in-line deposition system according to claim 1.

* * * * *

UNITED STATES PATENT AND TRADEMARK OFFICE
CERTIFICATE OF CORRECTION

PATENT NO. : 8,796,067 B2  
APPLICATION NO. : 13/303037  
DATED : August 5, 2014  
INVENTOR(S) : Cedric Rolin et al.

It is certified that error appears in the above-identified patent and that said Letters Patent is hereby corrected as shown below:

On the Title Page

Page 1 (item 73, Assignee) at line 4, Change "UniversitéCatholique" to --Université Catholique--.

Page 2 (item 56) at line 4, Under Other Publications, change "tramsistors"," to --transistors",--.

In the Specification

In column 1 at line 60, Change "preformed" to --performed--.

In column 3 at line 46, Change "minor" to --mirror--.

In column 3 at line 62, Change "minor" to --mirror--.

In column 5 at line 62, Change "minor" to --mirror--.

In column 9 at line 9, Change "$cm^2 V/s$" to --$cm^2/Vs$--.

In column 9 at line 49, Change "phtalocyanine" to --phthalocyanine--.

In column 9 at line 51, Change "phtalocyanines" to --phthalocyanines--.

In column 21 at line 43, Change "A/s." to --Å/s.--.

Signed and Sealed this  
Nineteenth Day of May, 2015

Michelle K. Lee  
*Director of the United States Patent and Trademark Office*